(12) United States Patent
Park et al.

(10) Patent No.: US 10,026,749 B2
(45) Date of Patent: Jul. 17, 2018

(54) SEMICONDUCTOR MEMORY DEVICES HAVING SEPARATION STRUCTURES

(71) Applicant: SAMSUNG ELECTRONICS CO., LTD., Suwon-si, Gyeonggi-Do (KR)

(72) Inventors: Jinwoo Park, Gunpo-si (KR); Jaeshin Park, Hwaseong-si (KR); Joyoung Park, Seoul (KR); Jiwoong Sue, Yongin-si (KR); Seok-Won Lee, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/349,084

(22) Filed: Nov. 11, 2016

(65) Prior Publication Data

US 2017/0200736 A1    Jul. 13, 2017

(30) Foreign Application Priority Data

Jan. 7, 2016 (KR) ........................ 10-2016-0002184

(51) Int. Cl.
| | | |
|---|---|---|
| *H01L 29/76* | (2006.01) | |
| *H01L 27/11582* | (2017.01) | |
| *H01L 21/768* | (2006.01) | |
| *H01L 23/528* | (2006.01) | |
| *H01L 27/02* | (2006.01) | |
| *H01L 29/06* | (2006.01) | |
| *H01L 27/11565* | (2017.01) | |
| *H01L 27/1157* | (2017.01) | |
| *H01L 27/11575* | (2017.01) | |

(52) U.S. Cl.
CPC .. *H01L 27/11582* (2013.01); *H01L 21/76879* (2013.01); *H01L 23/5283* (2013.01); *H01L 27/0207* (2013.01); *H01L 27/1157* (2013.01); *H01L 27/11565* (2013.01); *H01L 27/11575* (2013.01); *H01L 29/0649* (2013.01)

(58) Field of Classification Search
CPC ............ H01L 21/764; H01L 27/11524; H01L 27/11529; H01L 27/1157; H01L 27/11582; H01L 21/7682; H01L 21/76224; H01L 29/7926; H01L 27/11556; H01L 27/0207; H01L 27/11573; H01L 29/7889
See application file for complete search history.

(56) References Cited

U.S. PATENT DOCUMENTS

| | | | |
|---|---|---|---|
| 8,643,084 B2 | 2/2014 | Shin et al. | |
| 8,916,926 B2 | 12/2014 | Choe et al. | |
| 2010/0090286 A1* | 4/2010 | Lee ................... | H01L 27/11526 257/368 |
| 2012/0193700 A1* | 8/2012 | Kim .................. | H01L 27/11582 257/324 |

(Continued)

*Primary Examiner* — Khiem D Nguyen
(74) *Attorney, Agent, or Firm* — F. Chau & Associates, LLC

(57) ABSTRACT

A semiconductor memory device includes a substrate that includes a first cell array region and a peripheral region, a plurality of stack structures that extend in the first direction on the first cell array region and are spaced apart from each other in a second direction crossing the first direction, an insulation layer that covers the stack structures, and at least one separation structure that extends in the second direction on the peripheral region and penetrates the insulation layer in a direction normal to a top surface of the substrate.

15 Claims, 32 Drawing Sheets

(56) References Cited

U.S. PATENT DOCUMENTS

| | | |
|---|---|---|
| 2012/0280299 A1 | 11/2012 | Yun et al. |
| 2012/0307561 A1 | 12/2012 | Joo et al. |
| 2013/0059422 A1* | 3/2013 | Lee ................ H01L 21/764 438/268 |
| 2013/0286735 A1 | 10/2013 | Hwang et al. |
| 2014/0151777 A1* | 6/2014 | Sim ............. H01L 29/42324 257/315 |
| 2014/0175534 A1 | 6/2014 | Kofuji et al. |
| 2015/0008506 A1 | 1/2015 | Yang et al. |
| 2015/0126007 A1 | 5/2015 | Jang et al. |
| 2015/0145014 A1 | 5/2015 | Shin et al. |
| 2015/0145021 A1 | 5/2015 | Jang et al. |
| 2015/0179660 A1 | 6/2015 | Yada et al. |
| 2016/0225785 A1* | 8/2016 | Kim ............. H01L 27/11575 |

* cited by examiner

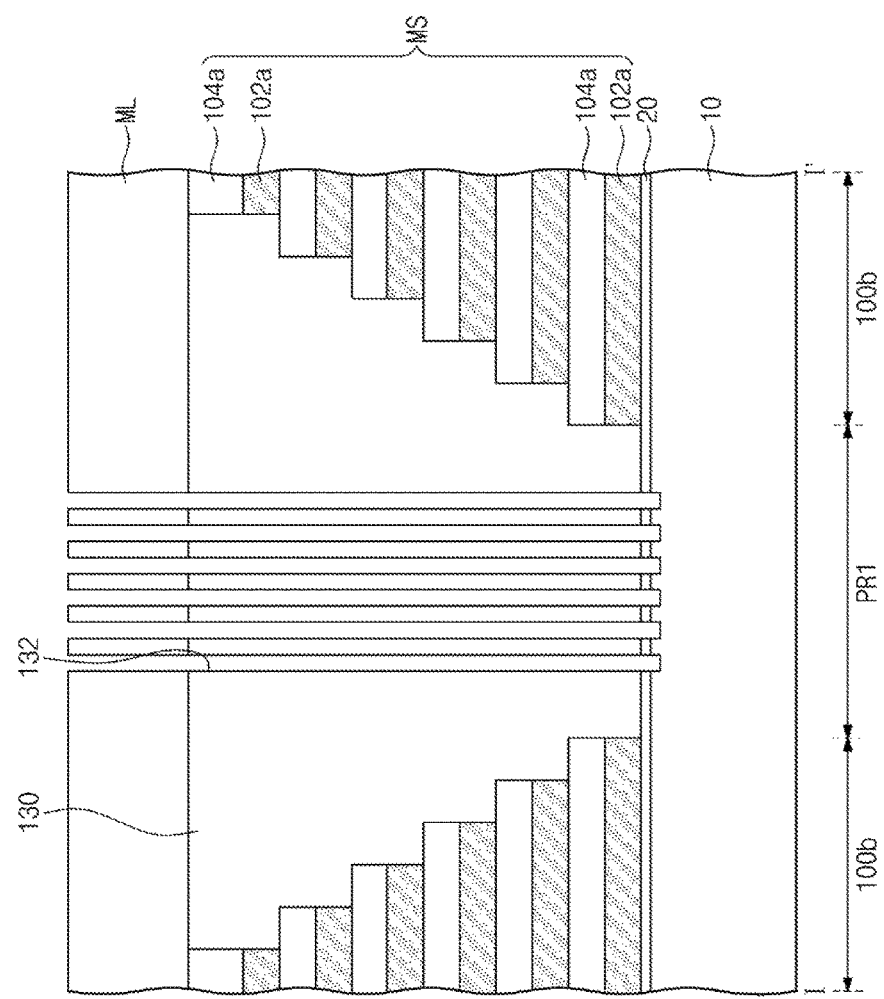

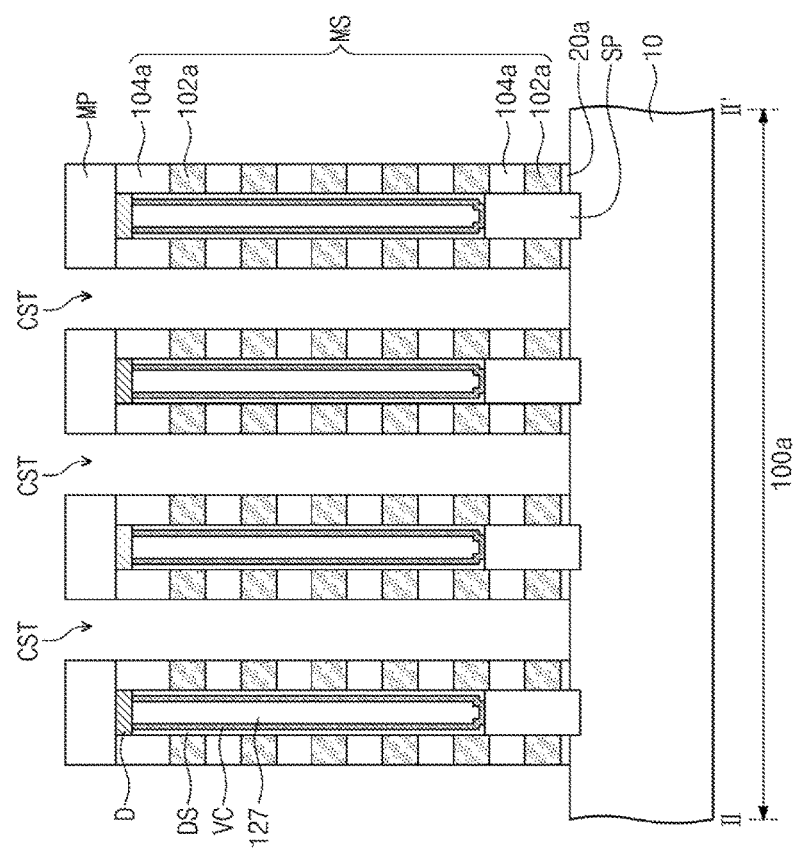

SEMICONDUCTOR MEMORY DEVICES HAVING SEPARATION STRUCTURES

CROSS-REFERENCE TO RELATED APPLICATIONS

This U.S. nonprovisional patent application claims priority under 35 U.S.C. § 119 from, and the benefit of, Korean Patent Application 10-2016-0002184, filed on Jan. 7, 2016 in the Korean Intellectual Property Office, the contents of which are herein incorporated by reference in their entirety.

BACKGROUND

Embodiments of the present inventive concept are directed to a semiconductor memory device and, more particularly, to a three-dimensional semiconductor memory device.

Semiconductor memory devices have become highly integrated to provide higher performance and to lower manufacturing costs of the devices. Since integration of the semiconductor memory devices is an important factor in determining product price, highly integrated semiconductor memory devices are in demand. The degree of integration of a typical two-dimensional or planar semiconductor memory device is primarily determined by the area occupied by a unit memory cell, which is influenced by the technology used to form fine patterns. However, the cost of the processing equipment needed to increase pattern fineness may set a practical limitation on the integration of a two-dimensional or planar semiconductor device.

To overcome these issues, three-dimensional semiconductor memory devices that have three-dimensionally arranged memory cells have been proposed. However, to mass produce three-dimensional semiconductor memory devices, new process technologies should be developed that can provide a lower manufacturing cost per bit than two-dimensional semiconductor devices while maintaining or exceeding their level of reliability.

SUMMARY

Embodiments of the present inventive concept provide a semiconductor memory device having improved reliability.

According to an exemplary embodiment of the present inventive concept, a semiconductor memory device includes a substrate that includes a first cell array region and a peripheral region, the peripheral region including first and second peripheral regions that face each other in a first direction with the first cell array region interposed therebetween; a plurality of stack structures that extend in the first direction on the first cell array region of the substrate and that are spaced apart from each other in a second direction crossing the first direction; an insulation layer that covers the stack structures; and at least one separation structure that extends in the second direction on at least one of the first and second peripheral regions and that penetrates the insulation layer in a direction wnormal to a top surface of the substrate.

According to an exemplary embodiment of the present inventive concept, a semiconductor memory device includes a substrate that includes a cell array region, a peripheral region, and a contact region between the cell array region and the peripheral region; a plurality of stack structures on the cell array region and the contact region of the substrate, the stack structures extending in a first direction and being spaced apart from each other in a second direction crossing the first direction; an insulation layer on the contact region and the peripheral region of the substrate, the insulation layer covering the stack structures; and a plurality of separation structures that extend in the second direction and that penetrate the insulation layer on the peripheral region in a third direction that is normal to a top surface of the substrate.

According to an exemplary embodiment of the present inventive concept, a method of fabrication a semiconductor device includes providing a substrate that includes a cell array region, a peripheral circuit region, and a contact region on a circumference of the cell array region; forming a mold structure on the substrate that includes sacrificial layers and insulation layers stacked alternately and repeatedly on the substrate; patterning the mold structure to form channel holes on the cell array region of the substrate and to have a stair-shape side; forming an interlayer dielectric pattern on the contact region and the peripheral region that covers the stair-shaped sides of the mold structure; forming a mask layer on the mold structure and the interlayer dielectric pattern that has openings on the peripheral circuit region of the substrate that partially expose the interlayer dielectric pattern on the peripheral circuit region; etching the interlayer dielectric pattern using the mask layer as an etch mask to form trenches in the interlayer dielectric pattern; removing the mask layer; and forming capping patterns to fill upper portions of the trenches.

BRIEF DESCRIPTION OF THE DRAWINGS

FIGS. 20A through 25A are cross-sectional views taken along line I-I' of

FIG. 5 that illustrate a method of fabricating a semiconductor device according to exemplary embodiments of the present inventive concept.

FIGS. 20B through 25B are cross-sectional views taken along line II-II' of FIG. 5 that illustrate a method of fabricating a semiconductor device according to exemplary embodiments of the present inventive concept.

DETAILED DESCRIPTION OF EXEMPLARY EMBODIMENTS

Figure 1:
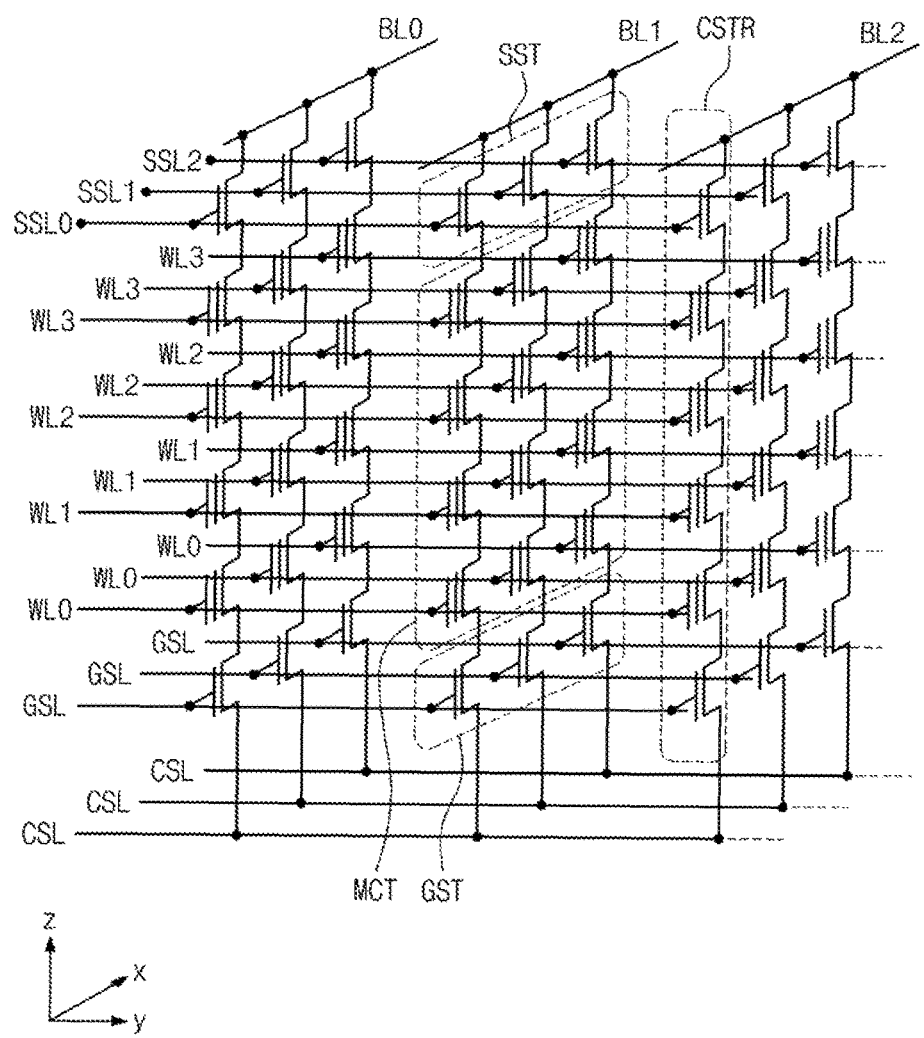
FIG. 1 is a circuit diagram that illustrates a semiconductor device according to exemplary embodiments of the present inventive concept.

FIG. 1 is a circuit diagram that illustrates a semiconductor device according to exemplary embodiments of the present inventive concept.

Referring to FIG. 1, a semiconductor device according to an embodiment includes a common source line CSL, a plurality of bit lines BL0~BL2, and a plurality of cell strings CSTR between the common source line CSL and the bit lines BL0~BL2.

According to embodiments, common source line CSL is a conductive layer provided on a semiconductor substrate or an impurity region disposed in the semiconductor substrate. The bit lines BL0~BL2 are conductive patterns, such as metal lines, disposed on and spaced apart from the semiconductor substrate. The bit lines BL0~BL2 are arranged two-dimensionally, and each of the bit lines BL0~BL2 is connected in parallel to a plurality of cell strings CSTR. Accordingly, the cell strings CSTR are arranged two-dimensionally on the common source line CSL or the semiconductor substrate.

According to embodiments, each of the cell strings CSTR includes a ground selection transistor GST, a string selection transistor SST connected to one of the bit lines BL0~BL2, and a plurality of memory cell transistors MCT between the ground selection transistor GST and the string selection transistor SST. The ground selection transistor GST, the plurality of memory cell transistors MCT, and the string selection transistor SST are connected in series. A ground selection line GSL, a plurality of word lines WL0~WL3, and a plurality of string selection lines SSL0~SSL2 respectively serve as a gate electrode of the ground selection transistor GST, gate electrodes of the memory cell transistors MCT, and a gate electrode of the string selection transistor SST.

According to embodiments, the ground selection transistors GST are spaced apart from the semiconductor substrate by substantially the same distance, and the gate electrodes thereof are commonly connected to the ground selection line GSL to have the same potential. The ground selection line GSL is disposed between the common source line CSL and the most adjacent memory cell transistor MCT. Similarly, the gate electrodes of the memory cell transistors MCT, which are spaced apart from the common source line CSL by substantially the same distance, are also be commonly connected to one of the word lines WL0~WL3 to have the same potential. A single cell string CSTR includes a plurality of memory cell transistors MCT, which are spaced apart from the common source line CSL by different distances, and thus a plurality of word lines WL0~WL3 can be disposed between the common source line CSL and each of the bit lines BL0~BL2.

According to embodiments, the ground selection transistor GST, the string selection transistor SST, and the memory cell transistors MCT are MOSFETs, which use channel structures as channel regions. In this case, the ground selection transistor GST, the memory cell transistors MCT, and the string selection transistor SST are electrically connected to each other by sharing inversion layers formed by fringe fields generated from the ground selection line GSL, the word lines WL0~WL3, and the string selection lines SSL.

Figure 2:
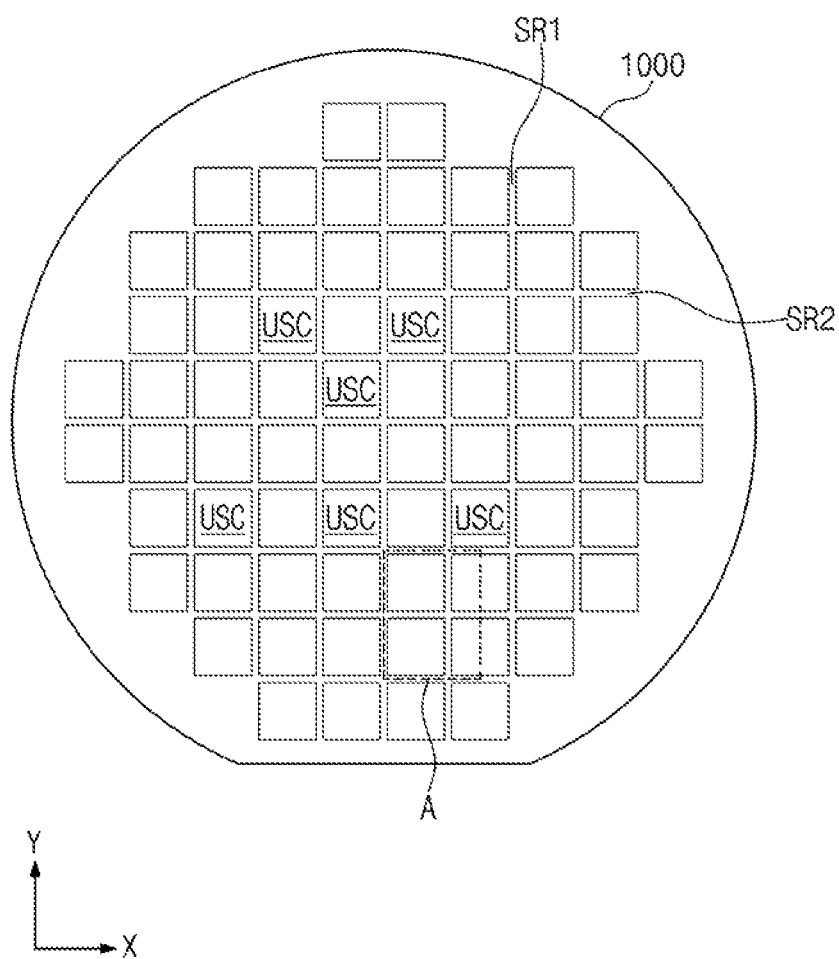
FIG. 2 is a plan view that illustrates a semiconductor wafer according to exemplary embodiments of the present inventive concept.
Figure 3A:
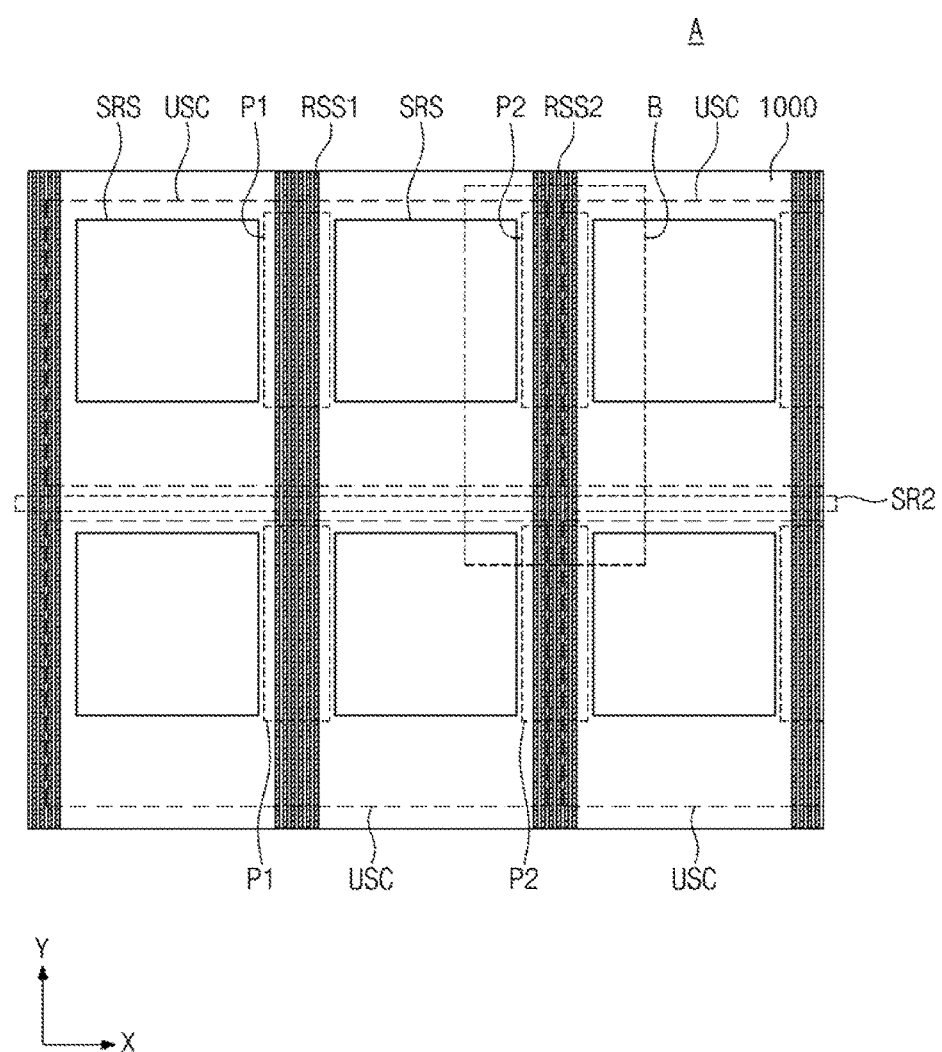
FIG. 3A is an enlarged plan view of section A of FIG. 2.
Figure 3B:
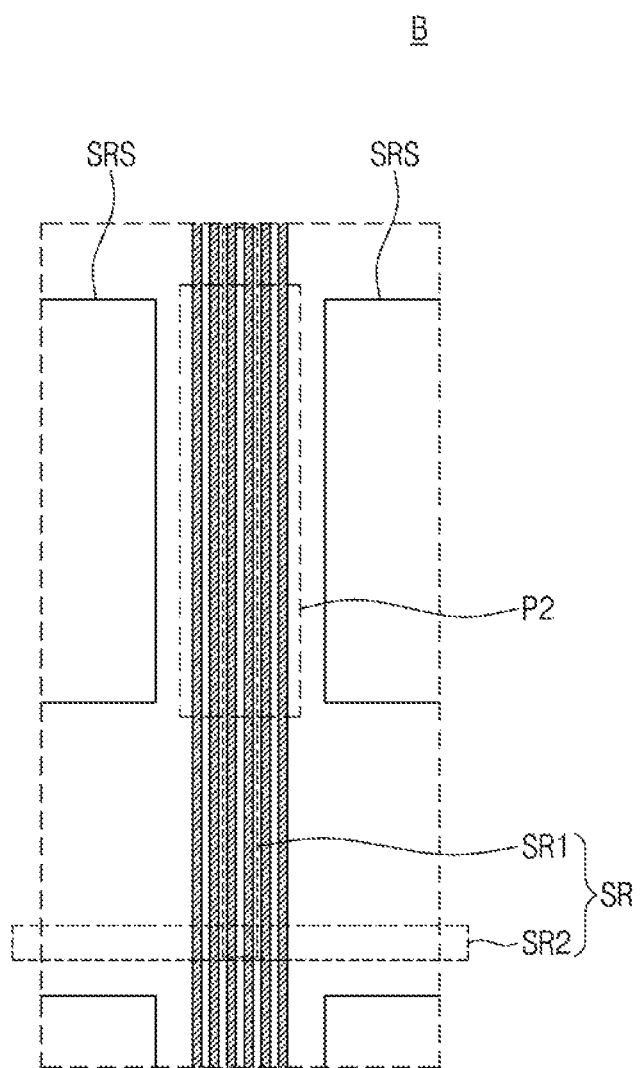
FIG. 3B is an enlarged plan view of section "B" of FIG. 3A.

FIG. 2 is a plan view that illustrates a semiconductor wafer according to exemplary embodiments of the present inventive concept. FIG. 3A is an enlarged plan view of section A of FIG. 2. FIG. 3B is an enlarged plan view of section "B" of FIG. 3A.

Referring to FIGS. 2, 3A and 3B, a semiconductor wafer 1000 according to an embodiment includes a plurality of unit semiconductor chips USC. The unit semiconductor chips USC are arranged in an array, spaced apart from each other along a first direction X and a second direction Y crossing the first direction X.

For example, a single unit semiconductor chip USC may include a pair of cell arrays SRS facing each other in the first direction X. According to embodiments, the cell arrays SRS correspond to regions on which a plurality of memory cell gates are disposed. The semiconductor wafer 1000 includes a first part P1 and a second part P2, each positioned between the cell arrays SRS adjacent to each other in the first direction X.

According to embodiments, a plurality of first separation structures RSS1 are disposed on the first part P1 of the semiconductor wafer 1000, and a plurality of second separation structures RSS2 are disposed on the second part P2 of the semiconductor wafer 1000. The first separation structures RSS1 are spaced apart from each other in the first direction X, and the second separation structures RSS2 are spaced apart from each other in the first direction X. The first separation structures RSS1 and the second separation structures RSS2 extend in the second direction Y. In an embodiment, the number of the first separation structures RSS1 is same as the number of the second separation structures RSS2.

As illustrated in FIGS. 3A and 3B, the semiconductor wafer 1000 includes a plurality of scribing regions SR1 and SR2. According to embodiment, the scribing regions SR1 and SR2 include a first scribing region SR1 positioned between the unit semiconductor chips USC facing each other in the first direction X, and a second scribing region SR2 connected to the first scribing region SR1 and positioned between the unit semiconductor chips USC facing each other in the second direction Y. The first scribing region SR1 may be a portion of the second part P2 of the semiconductor wafer 1000.

In an embodiment, the first separation structures RSS1 extend across the first part P1 and the second scribing region SR2 of the semiconductor wafer 1000. The second separation structures RSS2 extend across the second part P2 and the second scribing region SR2.

Figure 4:
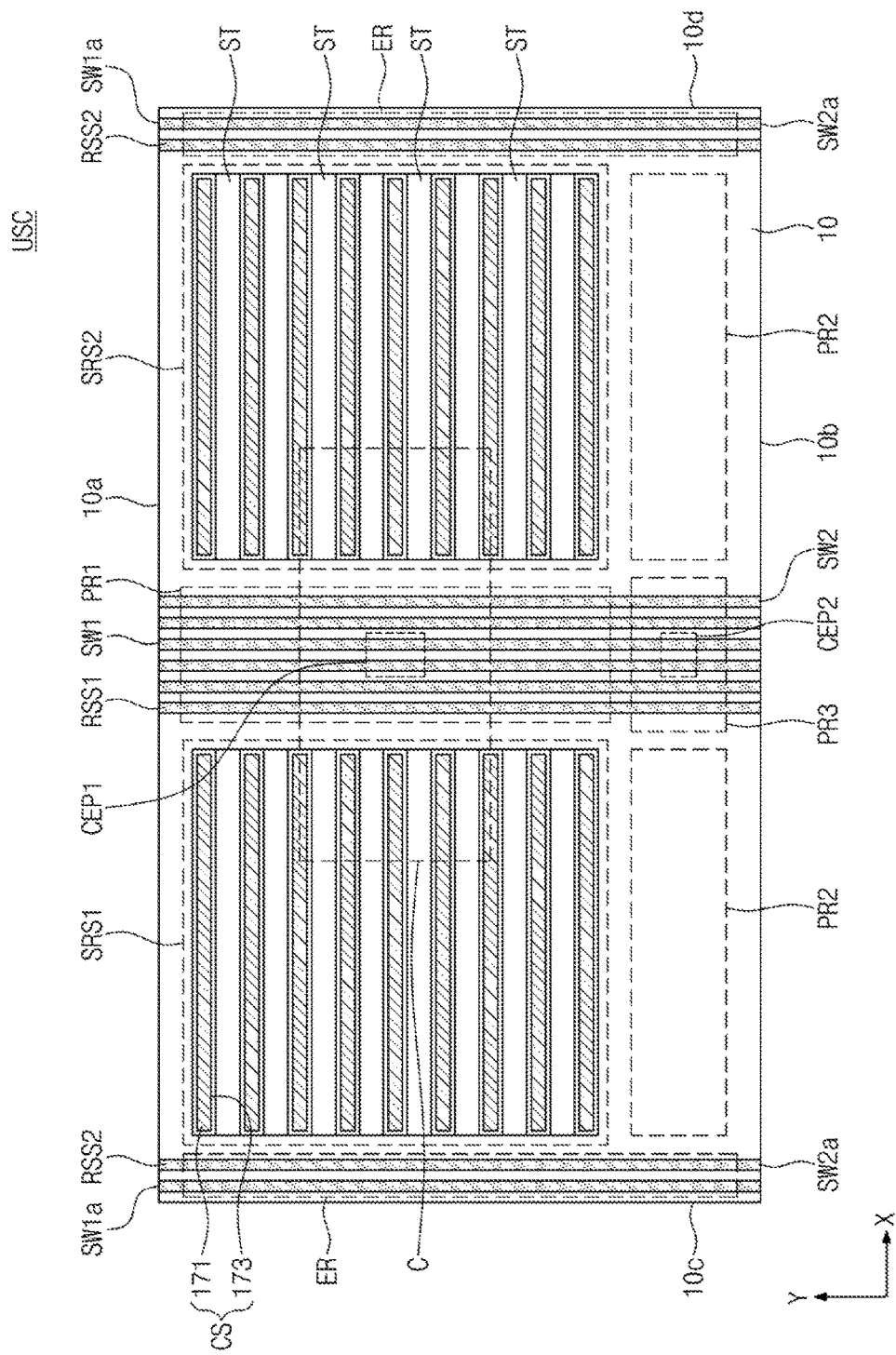
FIG. 4 is a plan view that illustrates a single unit semiconductor chip that includes a semiconductor memory device according to exemplary embodiments of the present inventive concept.

A detailed description of a single unit semiconductor chip is given with reference to FIG. 4.

FIG. 4 is a plan view that illustrates a single unit semiconductor chip that includes a semiconductor memory device according to exemplary embodiments of the present inventive concept.

Referring to FIG. 4, a substrate 10 according to an embodiment includes a first surface 10a, a second surface 10b, a third surface 10c, and a fourth surface 10d. As viewed in a plan view, the first surface 10a and the second surface 10b face each other in the second direction Y, and the third surface 10c and the fourth surface 10d face each other in the first direction X. The substrate 10 corresponds to the semiconductor wafer 1000 of FIG. 3A.

According to embodiments, the substrate 10 includes a pair of first and second memory device regions SRS1 and SRS2, a first peripheral circuit region PR1, second peripheral circuit regions PR2, a third peripheral circuit region PR3, and edge regions ER. The first and second memory device regions SRS1 and SRS2 are disposed to face each other in the first direction X, and the first peripheral circuit region PR1 is disposed between the first and second memory device regions SRS1 and SRS2. The first peripheral circuit region PR1 corresponds to the first part P1 of the semiconductor wafer 1000 of FIG. 3A.

According to embodiments, each of the second peripheral circuit regions PR2 is disposed between the second surface 10b and the first memory device region SRS1 and between the second surface 10b and the second memory device region SRS2, as viewed in a plan view. The third peripheral circuit region PR3 is disposed between the second peripheral circuit regions PR2 and between the first peripheral circuit region PR1 and the second surface 10b. One of the edge regions ER is disposed between the first memory device region SRS1 and the third surface 10c. The other of the edge regions ER may be disposed between the second memory device region SRS2 and the fourth surface 10d. A plurality of stack structures ST are disposed on the first and second memory device regions SRS1 and SRS2 so as to constitute cell arrays. The stack structures ST have a long axis extending in the first direction X and are spaced apart from each other in the second direction Y. Each of the stack structures ST on the first memory device region SRS1 faces each of the stack structures ST on the second memory device region SRS2 in the first direction X. The stack structures ST on the first and second memory devices SRS1 and SRS2 includes independently operable memory devices.

Peripheral transistors may be disposed on the first peripheral circuit region PR1 of the substrate 10. In an embodiment, the first peripheral circuit region PR1 is an area for a row decoder of the semiconductor memory device. Transistors disposed in the row decoder region provide signals to the ground selection line, the word lines WL0~WL3, and the string selection lines SSL0~SSL2 included in the cell arrays disposed on the first and second memory device regions SRS1 and SRS2, of the semiconductor device depicted in FIG. 1.

According to embodiments, peripheral transistors are disposed on the second peripheral circuit region PR2 of the substrate 10. In an embodiment, the second peripheral circuit region PR2 is a page buffer area for the semiconductor device. Transistors disposed in the page buffer region provide signals to the bit lines BL1~BL3 included in the cell arrays, which are disposed on the first and second memory device regions SRS1 and SRS2, of the semiconductor device depicted in FIG. 1.

According to embodiments, peripheral transistors are disposed on the third peripheral circuit region PR3 of the substrate 10. In an embodiment, the third peripheral circuit region PR3 is an area for control logic of a semiconductor device. Transistors disposed in the control logic region provide signals to peripheral transistors in the row decoder.

According to embodiments, the first separation structures RSS1 are disposed in the first peripheral circuit region PR1 of the substrate 10, and the second separation structures RSS2 are disposed in the edge regions ER of the substrate 10. The first and second separation structures RSS1 and RSS2 extend along a direction that crosses an extending direction of the stack structures ST. For example, the stack structures ST may extend in the first direction X, and the first and second separation structures RSS1 and RSS2 may extend in the second direction Y. The first separation structures RSS1 extend across the first and third peripheral circuit regions PR1 and PR3, and the second separation structures RSS2 extend across the edge regions ER.

According to embodiments, each of the first separation structures RSS1 includes a first surface SW1 and a second surface SW2 which face each other in the second direction Y, and each of the second separation structures RSS2 includes a first surface SW1a and a second surface SW2a which face each other in the second direction Y. The first surfaces SW1 and SW1a of the first and second separation structures RSS1 and RSS2 adjoin the first surface 10a of the substrate 10, and the second surfaces SW2 and SW2a of the first and second separation structures RSS1 and RSS2 adjoin the second surface 10b of the substrate 10. In an embodiment, the first surface 10a of the substrate 10 is coplanar with the first surfaces SW1 and SW1a of the first and second separation structures RSS1 and RSS2. Similarly, the second surface 10b of the substrate 10 is coplanar with the second surfaces SW2 and SW2a of the first and second separation structures RSS1 and RSS2.

In an embodiment, the first separation structures RSS1 are disposed to not affect the transistors included in the first and third peripheral circuit regions PR1 and PR3. For example, in case that the transistors are disposed on a central portion CEP1 of the first peripheral circuit region PR1 and a central portion CEP2 of the third peripheral circuit region PR3, the first separation structures RSS1 are not disposed on the central portions CEP1 and CEP2 of the first and third peripheral circuit regions PR1 and PR3. In other words, the two first separation structures RSS1 extend across but do not lie on the central portions CEP1 and CEP2 of the first and third peripheral circuit regions PR1 and PR3.

Referring to FIGS. 3B and 4, according to embodiments, each of the edge regions ER corresponds to a portion of the second part P2 except the first scribing region SR1 and a portion of the second scribing region SR2. The number of first separation structures RSS1 is greater than that of the second separation structures RSS2.

Detail descriptions of the cell arrays and separation structures of the semiconductor device are given below with reference to accompanying figures.

Figure 5:
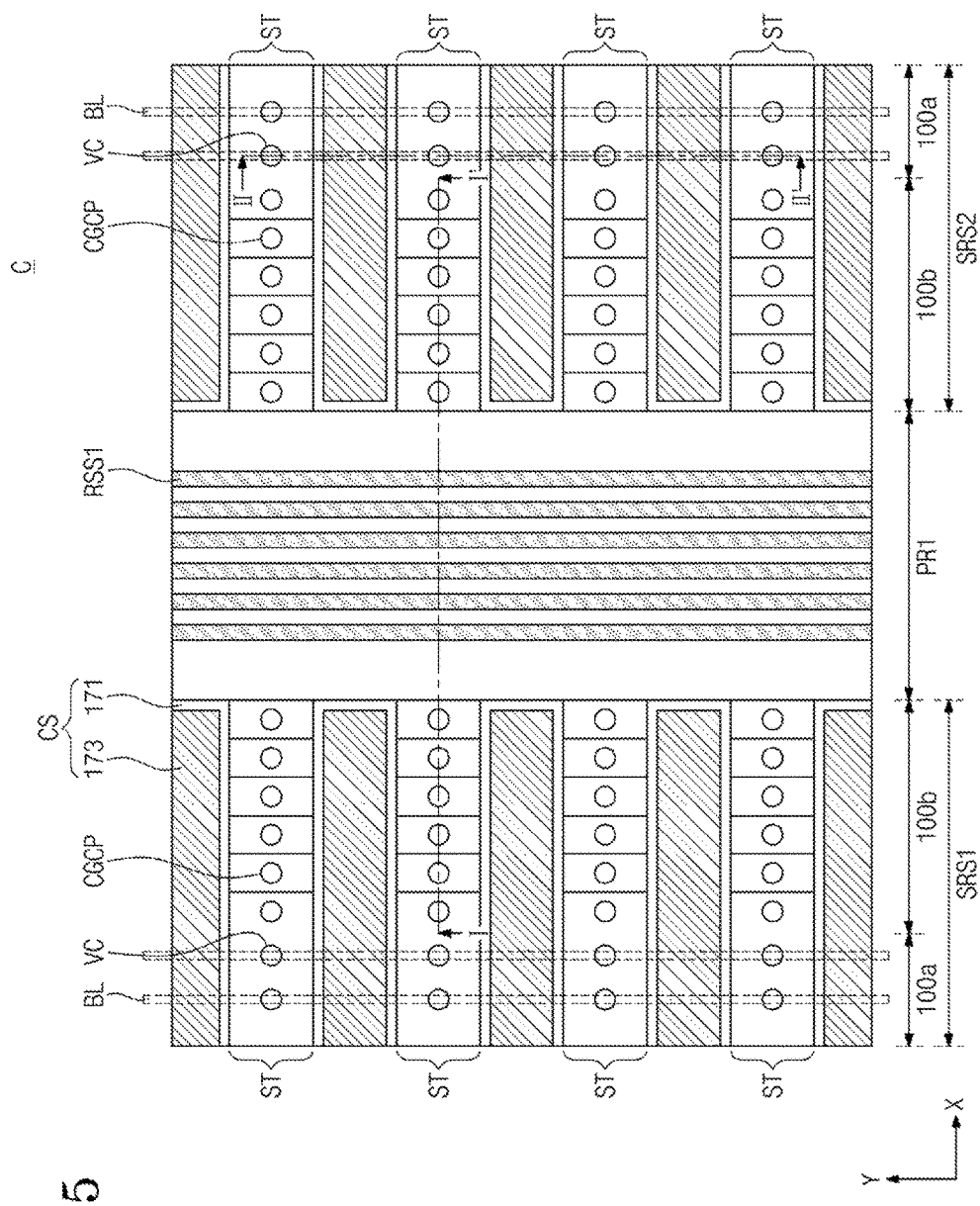
FIG. 5 is an enlarged plan view of section C of FIG. 4 that illustrates a semiconductor device according to exemplary embodiments of the present inventive concept.
Figure 6:
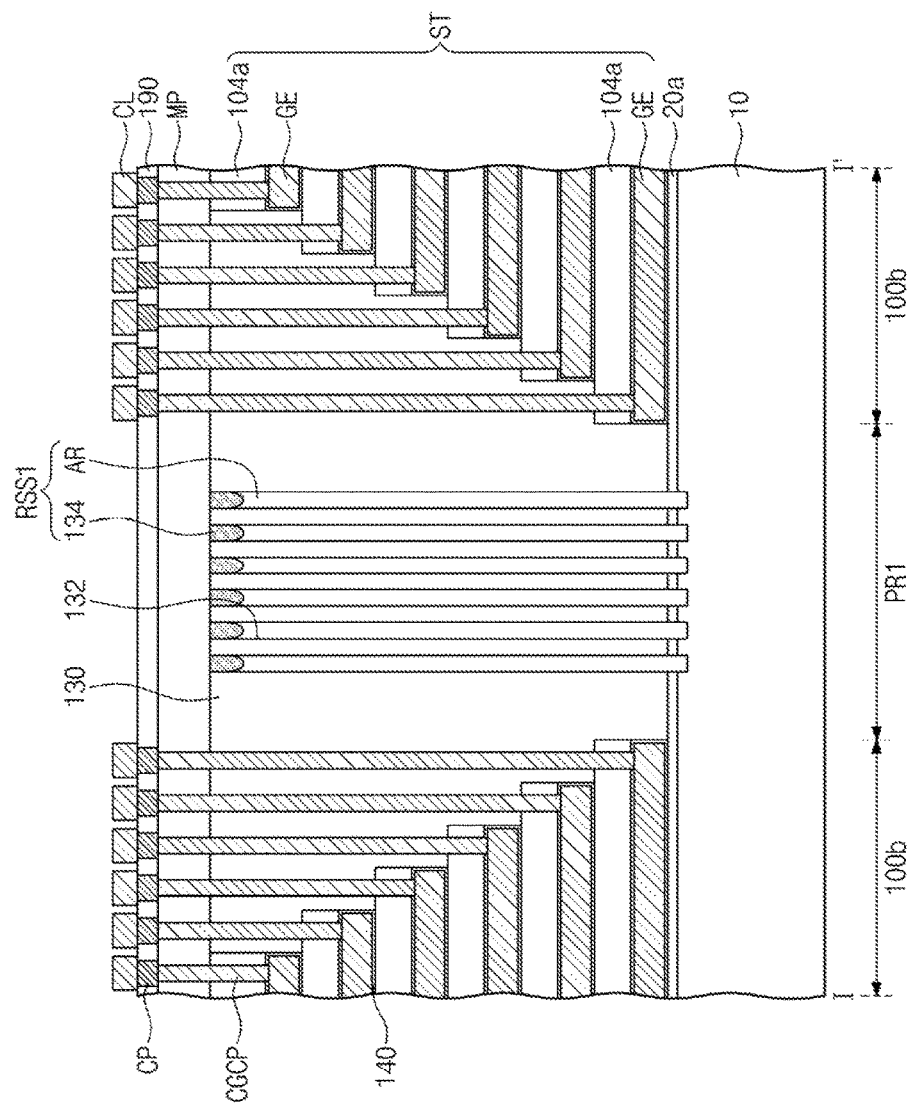
FIG. 6 is a cross-sectional view taken along line I-I' of FIG. 5.
Figure 7:
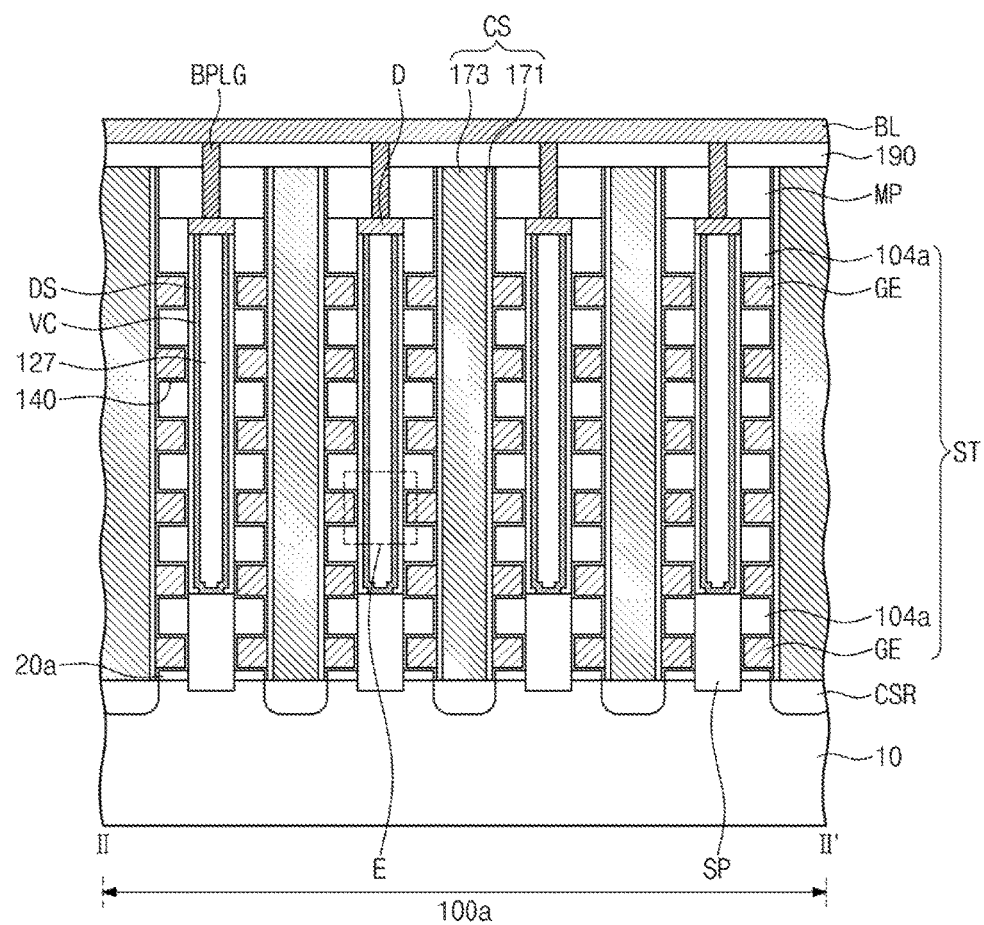
FIG. 7 is a cross-sectional view taken along line II-II' of FIG. 5.
Figure 8:
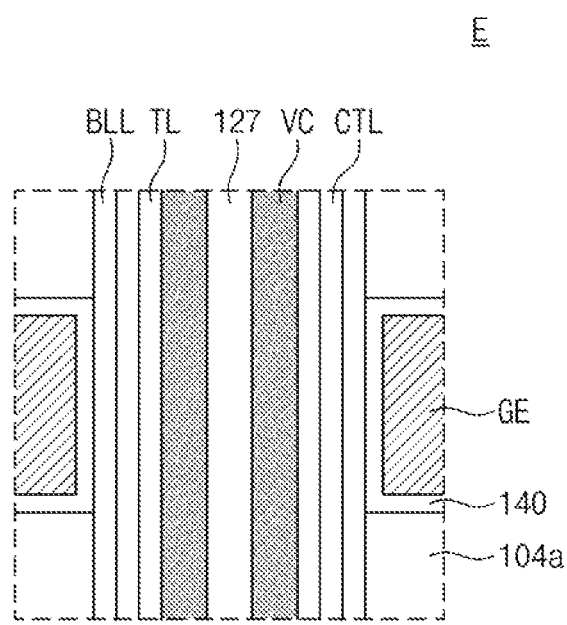
FIG. 8 is an enlarged view of section E of FIG. 7.
Figure 9:
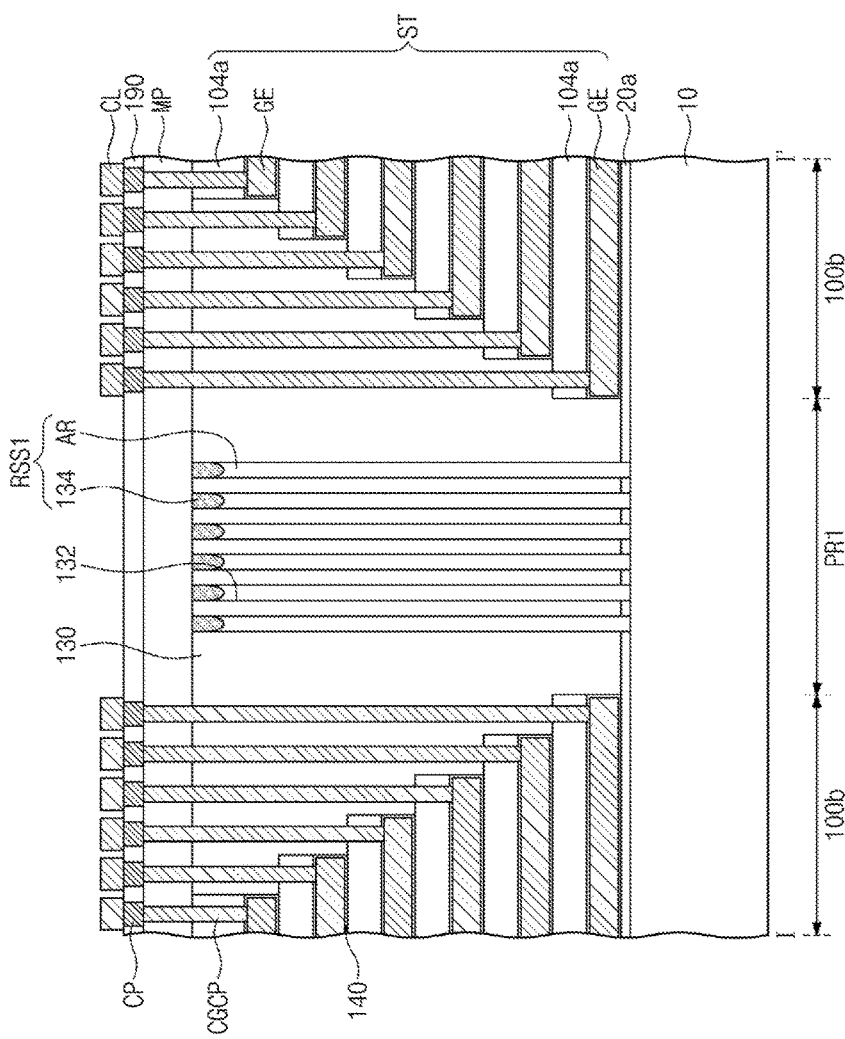
FIGS. 9 through 11 are cross-sectional views taken along line I-I' of FIG. 5.
Figure 10:
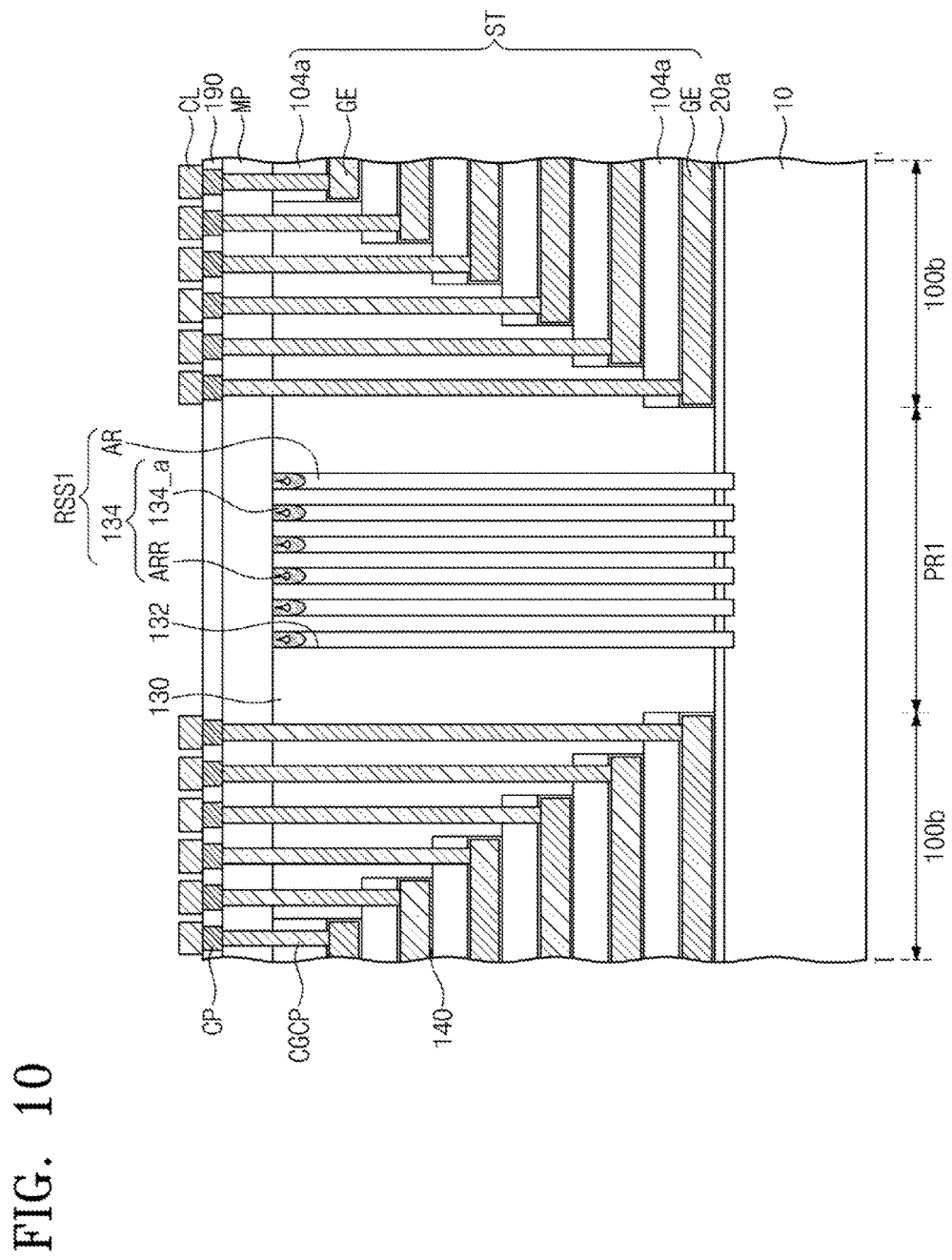
Figure 11:
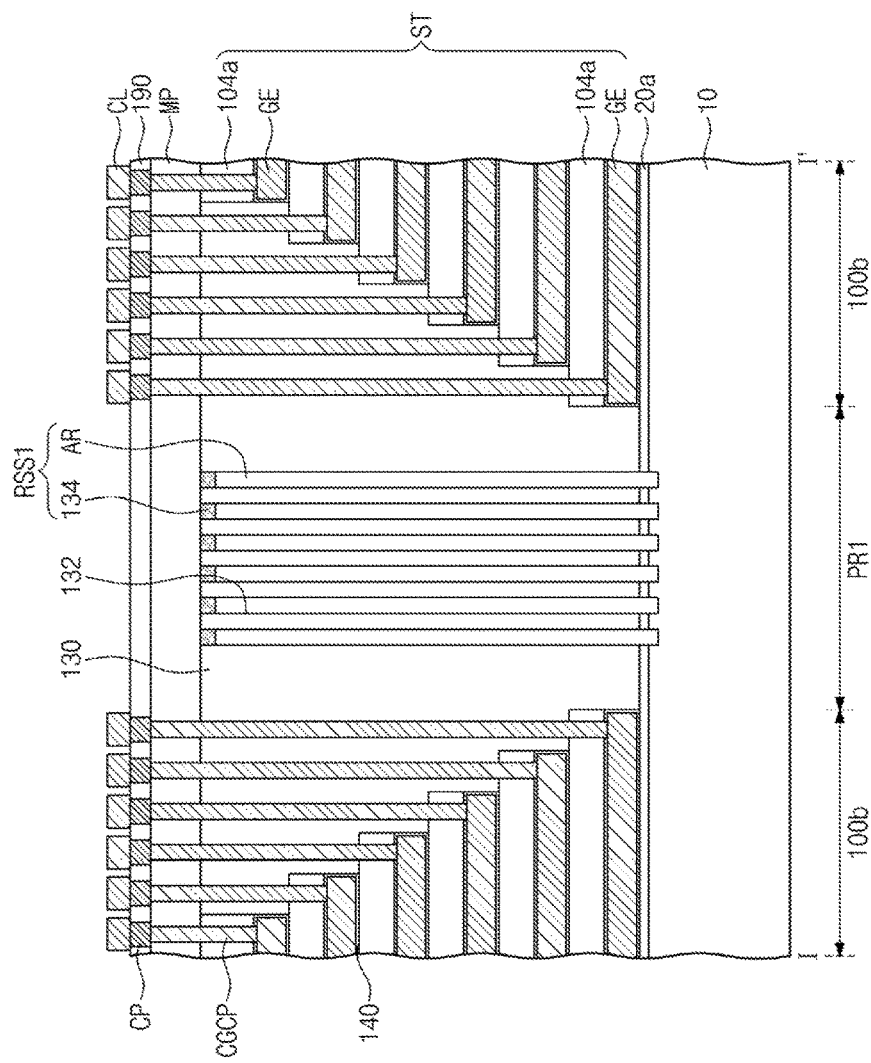

FIG. 5 is an enlarged plan view of section C of FIG. 4 that illustrates a semiconductor device according to exemplary embodiments of the present inventive concept. FIG. 6 is a cross-sectional view taken along line I-I' of FIG. 5. FIG. 7 is a cross-sectional view taken along line II-II' of FIG. 5. FIG. 8 is an enlarged view of section E of FIG. 7. FIGS. 9 through 11 are cross-sectional views taken along line I-I' of FIG. 5.

Referring to FIGS. 5, 6 and 7, according to embodiments, each of the first and second memory device regions SRS1 and SRS2 includes a cell array region 100a and a contact region 100b. The contact region 100b is disposed at the circumference of the cell array region 100a. A portion of the contact region 100b is disposed between the cell array region 100a and the first peripheral circuit region PR1. The substrate 10 may be a silicon substrate, a silicon-germanium substrate, a germanium substrate, or a single crystalline silicon substrate having an epitaxial layer grown thereon.

According to embodiments, a plurality of stack structures ST are disposed on each of the first and second memory device regions SRS1 and SRS2. The stack structures ST are disposed on the cell array and contact regions 100a and 100b of the substrate 10. A cell impurity region CSR, shown in FIG. 7, is disposed in the substrate 10 between stack structures ST adjacent to each other in the second direction Y. The cell impurity region CSR extends in the first direction X. The cell impurity region CSR corresponds to the common source line CSL of FIG. 1. The cell impurity region CSR has a conductivity type different from that of the substrate 10.

According to embodiments, each of the stack structures ST includes insulation patterns 104a which are vertically stacked with respect to a top surface of the substrate 10 and gate electrodes GE interposed between the insulation patterns 104a. For example, the insulation patterns 104a and the gate electrodes GE may be stacked alternately and repeatedly on the substrate 10. The insulation patterns 104a may include, for example, silicon oxide layers. A buffer insulation pattern 20a is further disposed between the substrate 10 and the stack structure ST. The buffer insulation pattern 20a may include, for example, a silicon oxide layer.

The gate electrodes GE may include a ground selection gate electrode, a string selection gate electrode, or cell gate electrodes. According to embodiments, the lowermost gate electrode GE serves as the ground selection gate and corresponds to the ground selection line GSL of FIG. 1. The uppermost gate electrode GE serves as the string selection gate and corresponds to one of the string selection lines SSL0~SSL2 of FIG. 1. The intervening gate electrodes between the uppermost and lowermost gates serve as cell gate electrodes and correspond to the word lines WL0~WL3 of FIG. 1.

According to embodiments, the gate electrodes GE extend in the first direction X. Some of the gate electrodes GE are disposed on the contact region 100b. End portions of the gate electrodes GE are exposed on the contact region 100b. The gate electrodes GE have different lengths from each other. For example, the lengths of the gate electrodes GE may decrease with increasing distance from the substrate 10.

According to embodiments, the insulation patterns 104a extend in the first direction X, and lengths of the insulation patterns 104a varies depending on the lengths of the gate electrodes GE. For example, an insulation pattern 104a may have a length substantially the same as the length of the gate electrode GE directly beneath the insulation pattern 104a. Accordingly, the insulation patterns 104a respectively cover the end portions of the gate electrodes GE disposed directly under the insulation patterns 104a. Thus, the stack structure ST on the contact region 100b of the substrate 10 has a stair-shape.

The gate electrode GE may include at least one of, for example, doped silicon, a metal, such as tungsten, copper, aluminum, etc., a conductive metal nitride, such as titanium nitride, tantalum nitride, and a transitional metal, such as titanium, tantalum, etc.

According to embodiments, a plurality of vertical channels VC respectively penetrate the stack structures ST along a direction that is normal to the top surface of the substrate 10. As viewed in a plan view, the plurality of vertical channels VC may be arranged linearly or in a zigzag pattern in the first direction X. The vertical channel VC may have a shape of hollow pipe or a cylinder. The vertical channel VC includes a semiconducting material. For example, the vertical channel VC may include at least one of a polycrystalline silicon layer, an organic semiconductor layer, or a carbon nanostructure.

According to embodiments, a charge storage structure DS is disposed between the stack structure ST and the vertical channel VC. For example, the charge storage structure DS may be disposed between the gate electrode GE and the vertical channel VC, and may vertically extend along a sidewall of the vertical channel VC. The charge storage structure DS has a shape that surrounds an outer wall of the vertical channel VC.

According to embodiments, as shown in FIG. 8, the charge storage structure DS includes a blocking insulation layer BLL, a charge storage layer CTL, and a tunnel insulation layer TL. The blocking insulation layer BLL is disposed between the vertical channel VC and the gate electrode GE, and the tunnel insulation layer TL is disposed between the blocking insulation layer BLL and the vertical channel VC. The charge storage layer CTL is disposed between the blocking insulation layer BLL and the tunnel insulation layer TL. The blocking insulation layer BLL may include a silicon oxide layer or a high-k dielectric layer, such as an aluminum oxide ($Al_2O_3$) layer or a hafnium oxide ($HfO_2$) layer, the charge storage layer CTL includes a silicon nitride layer, and the tunnel insulation layer TL may include a silicon oxide layer or a high-k dielectric layer, such as an aluminum oxide ($Al_2O_3$) layer or a hafnium oxide ($HfO_2$) layer.

According to embodiments, a gap fill layer 127 is disposed in an inner space surrounded by the vertical channel VC. The gap fill layer 127 includes an insulating material layer such as a silicon oxide layer, a silicon nitride layer, or a silicon oxynitride layer.

According to embodiments, a pad D is disposed on top surfaces of the vertical channel VC, the charge storage structure DS, and the gap fill layer 127. The pad D is electrically connected to the vertical channel VC. The pad D includes a conducting material. Alternatively, the pad D includes a semiconducting material doped by impurities whose conductivity type is different from that of the vertical channel VC.

According to embodiments, a horizontal insulation layer 140 is disposed between the charge storage structure DS and the gate electrode GE. The horizontal insulation layer 140 extends onto top and bottom surfaces of the gate electrode GE. The horizontal insulation layer 140 may include a silicon oxide layer, such as an $SiO_2$ layer, or a high-k dielectric layer, such as an aluminum oxide ($Al_2O_3$) layer or a hafnium oxide ($HfO_2$) layer.

Referring to FIG. 7, according to embodiments, a semiconductor pillar SP is disposed between the vertical channel VC and the substrate 10. The semiconductor pillar SP is disposed on the top surface of the substrate 10 and penetrates the lowermost gate electrode GE. The vertical channel VC is in contact with and electrically connects to the semiconductor pillar SP. The semiconductor pillar SP may include semiconductor whose conductivity type is the same as that of the substrate 10 or an intrinsic semiconductor. For example, the semiconductor pillar SP may be an intrinsic single crystalline semiconductor or a p-type semiconductor.

As shown in FIG. 6, according to embodiments, an interlayer dielectric pattern 130 is disposed on the contact region 100b and the first peripheral circuit region PR1. The interlayer dielectric pattern 130 on the contact region 100b covers the stair-shaped stack structure ST, and the interlayer dielectric pattern 130 on the first peripheral circuit region PR1 covers a portion of the buffer insulation pattern 20a. The interlayer dielectric layer 130 has a top surface whose level is the substantially same as that of a top surface of the uppermost insulation pattern 104a.

The interlayer dielectric pattern 130 may include, for example, HDP (high density plasma) oxide, TEOS (tetraethylorthosilicate), PE-TEOS (plasma enhanced tetraethylorthosilicate), O3-TEOS (O3-tetraethylorthosilicate), USG (undoped silicate glass), PSG (phosphosilicate glass), BSG (borosilicate glass), BPSG (borophosphosilicate glass), FSG (fluoridesilicate glass), SOG (spin on glass), TOSZ (tonen silazene), or any combination thereof. Alternatively, the interlayer dielectric layer 130 may include silicon nitride, silicon oxynitride, or a low-k material having a low dielectric constant.

According to embodiments, the first separation structures RSS1 are disposed on the first peripheral circuit region PR1 of the substrate 10. As viewed in a plan view, the first separation structures RSS1 are interposed between the stack structures ST facing each other in the first direction X and extend in the second direction Y. The first separation structures RSS1 penetrate the interlayer dielectric pattern 130 along a direction normal to the top surface of the substrate 10. Each of the first separation structures RSS1 includes a capping pattern 134 and an air gap AR. The capping pattern 134 is disposed in a trench 132 that is recessed from the top surface of the interlayer dielectric pattern 130 to expose the substrate 10. The air gap AR is formed within the trench 132 between the capping pattern 134 and the substrate 10. The air gap AR is a hollow space surrounded by the substrate 10, the capping pattern 134, and the interlayer dielectric pattern 130 exposed through sidewalls of the trench 132.

According to embodiments, the top surface of the substrate 10 is recessed by the trench 132. Accordingly, the trench 132 has a bottom surface whose level is lower than that of the top surface of the substrate 10. Alternatively, as shown in FIG. 9, the top surface of the substrate 10 is not recessed by the trench 132, so that the bottom surface of the trench 132 coincides with the top surface of the substrate 10.

According to embodiments, as viewed in a plan view, the capping pattern 134 extends in the second direction Y and has a linear or rectangular shape. The capping pattern 134 has a top surface coplanar with the top surface of the interlayer dielectric pattern 130. The capping pattern 134 has a bottom surface that convexly extends toward the substrate 10. The capping pattern 134 includes an insulating material with poor step coverage. The capping pattern 134 may include, for example, a TEOS (tetraethylorthosilicate) layer or an HDP (high density plasma) oxide layer. For example, the capping pattern 134 may include a material that is substantially the same as that of the interlayer dielectric layer 130.

The capping pattern 134 may have various shapes depending on a formation process.

For example, as shown in FIG. 10, the capping pattern 134 may include an additional air gap AAR and an insulation pattern 134_a. The insulation pattern 134_a may be disposed on the trench 132. The additional air gap AAR may be disposed in and surrounded by the insulation pattern 134_a.

Alternatively, as shown in FIG. 11, the capping pattern 134 may have a flat bottom surface.

The first separation structures RSS1 may be composed of a combination of the first separation structures RSS1 respectively depicted in FIGS. 6, 9, 10 and 11. According to embodiments, the first and second separation structures RSS1 and RSS2 have substantially the same shape.

According to embodiments, the gate electrodes GE included in each of the stack structures ST exert tensile stresses in the first direction X and compressive stresses in the second direction Y. A contact structure CS described below can be disposed between gate electrodes GE adjacent to each other in the second direction Y so that the compressive stresses from the adjacent gate electrodes GE do not connect to each other.

In other words, the contact structure CS can cut off connections of compressive stresses exerted from the gate electrodes GE adjacent to each other in the second direction Y.

According to embodiments, the tensile stresses exerted from the gate electrodes GE are connected to each other through the interlayer dielectric pattern 130 and the substrate 10. In other words, the interlayer dielectric pattern 130 and the substrate 10 can connect tensile stresses exerted from gate electrodes GE adjacent to each other in the first direction X. As a result, the gate electrodes GE exert tensile stresses in the first direction X whose magnitude is greater than that of the compressive stresses acting in the second direction Y, such that the semiconductor device 1000 may suffer from warping.

In an embodiment, the first separation structures RSS1 are disposed on regions, that is, the first and second parts P1 and P2 of the semiconductor wafer 1000 as illustrated in FIG. 3A, between the gate electrodes GE adjacent to each other in the first direction X, and thus can cut off connections of the tensile stresses acting in the first direction X. Accordingly, the semiconductor wafer 1000 may be free of warping, and have a more stable performance and be more reliable.

According to embodiments, a first interlayer dielectric layer MP is disposed on the interlayer dielectric pattern 130 and the stack structures ST. The first interlayer dielectric layer MP covers top surfaces of the uppermost insulation pattern 140a, the pad D, the interlayer dielectric pattern 130, and the capping pattern 134. The first interlayer dielectric layer MP may include, for example, a silicon oxide layer or a silicon nitride layer.

According to embodiments, the contact structures CS are disposed between stack structures ST adjacent to each other in the second direction Y. The contact structures CS are disposed on the substrate 10 and extend vertically from the top surface of the substrate 10 to penetrate the interlayer dielectric pattern 130 and the first interlayer dielectric layer MP. The contact structures CS are connected to the cell impurity region CSR. The contact structures CS extend along the cell impurity region CSR in the first direction X. The contact structures CS may have a rectangular or a linear shape that extends in the first direction X, in a plan view.

According to embodiments, the contact structure CS has a top surface whose level is higher than those of the top surfaces of the capping patterns 134.

According to embodiments, the contact structure CS includes a spacer 171 and a common source contact 173. The common source contact 173 is connected to the cell impurity region CSR disposed in the substrate 10. The common source contact 173 may include, for example, a metal, such as tungsten, copper, aluminum, etc., or a transitional metal, such as titanium, tantalum, etc. The spacer 171 is disposed between the common source contact 173 and the stack structure ST. The spacer 171 may include, for example, an insulator, such as silicon oxide or silicon nitride.

According to embodiments, cell contact plugs CGCP are disposed on each of the stack structures ST in the contact region 10b of the substrate 10. The cell contact plugs CGCP are electrically connected to the gate electrodes GE. For example, an uppermost cell contact plug CGCP may penetrate the first interlayer dielectric layer MP and the uppermost insulation pattern 104a, and may be disposed on an end of the uppermost gate electrode GE in the contact region 100b of the substrate 10. The cell contact plugs CGCP have top surfaces whose levels are higher than those of the top surfaces of the first separation structures RSS1.

The cell contact plugs CGCP may include at least one of a metal, such as tungsten, copper, aluminum, etc., a conductive metal nitride, such as titanium nitride, tantalum nitride, etc., or a transitional metal, such as titanium, tantalum, etc.

According to embodiments, a second interlayer dielectric layer 190 is disposed on the first interlayer dielectric layer MP. The second interlayer dielectric layer 190 covers top surfaces of the cell contact plugs CGCP and the contact structures CS. The second interlayer dielectric layer 190 may include, for example, a silicon oxide layer or a silicon nitride layer.

According to embodiments, contacts CP are disposed on the cell contact plugs CGCP, as illustrated in FIG. 6. The contacts CP penetrate the second interlayer dielectric layer 190 and are electrically connected to the cell contact plugs CGCP.

According to embodiments, bit line contact plugs BPLG are disposed on the pads D, as illustrated in FIG. 7. The bit line contact plugs BPLG penetrate the second interlayer dielectric layer 190 and the first interlayer dielectric layer MP on the cell array region 100a of the substrate 10. The contacts CP and the bit line contact plugs BPLG may include a metal, such as tungsten.

According to embodiments, bit lines BL are disposed on the bit line contact plugs BPLG, as illustrated in FIG. 7. As shown in FIG. 5, the bit lines BL cross the stack structures ST in the second direction Y. The contact plugs BPLG electrically connect vertical channels VC in the second direction Y to one of the bit lines BL.

According to embodiments, connection lines CL are disposed on the contacts CP. The contacts CP in the second direction Y electrically connect one of the connection lines CL to gate electrodes GE in the second direction Y at the same level.

Figure 12:
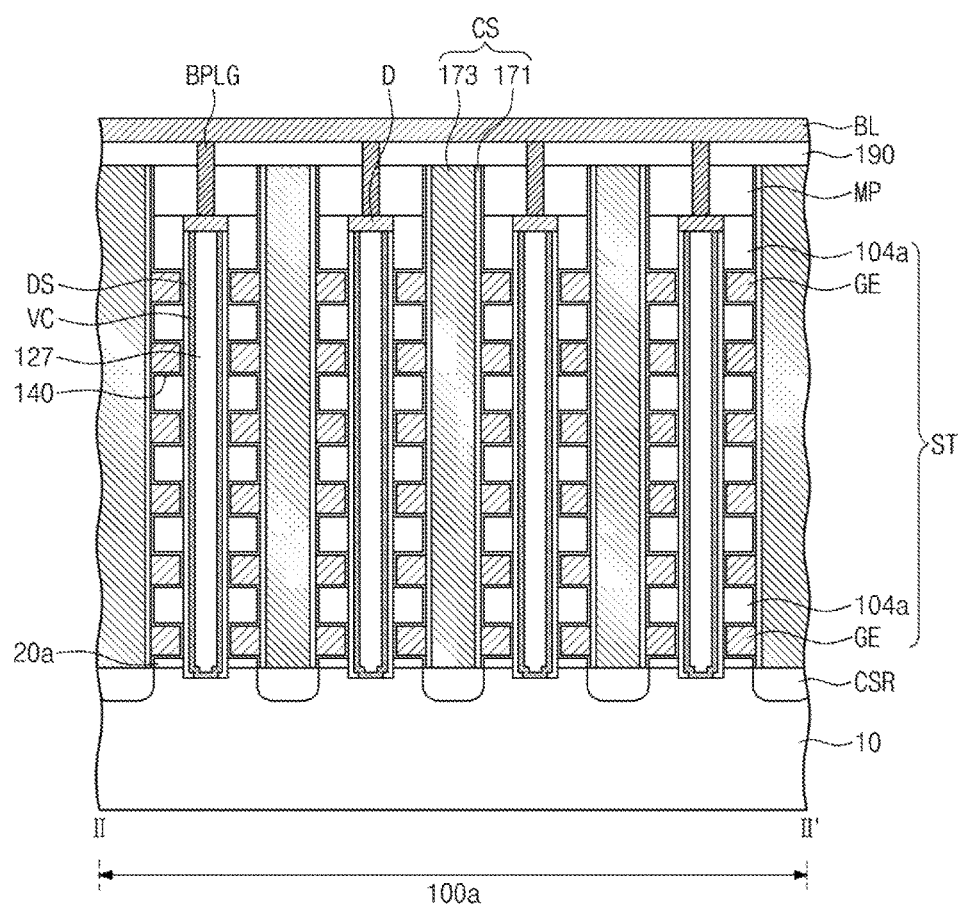
FIG. 12 is a cross-sectional view taken along line II-II' of FIG. 5.

FIG. 12 is a cross-sectional view taken along line II-II' of FIG. 5. For brevity of description, the same elements of a semiconductor memory device according to exemplary embodiments use the same reference numerals and duplicate explanations thereof are omitted.

Referring to FIG. 12, according to embodiments, the vertical channels VC and the charge storage structures DS penetrate the lowermost gate electrode GE and the buffer insulation pattern 20a to be in contact with the substrate 10. In other words, there is no semiconductor pillar SP disposed between the substrate 10 and each of the vertical channels VC and each of the charge storage structures DS.

Figure 13:
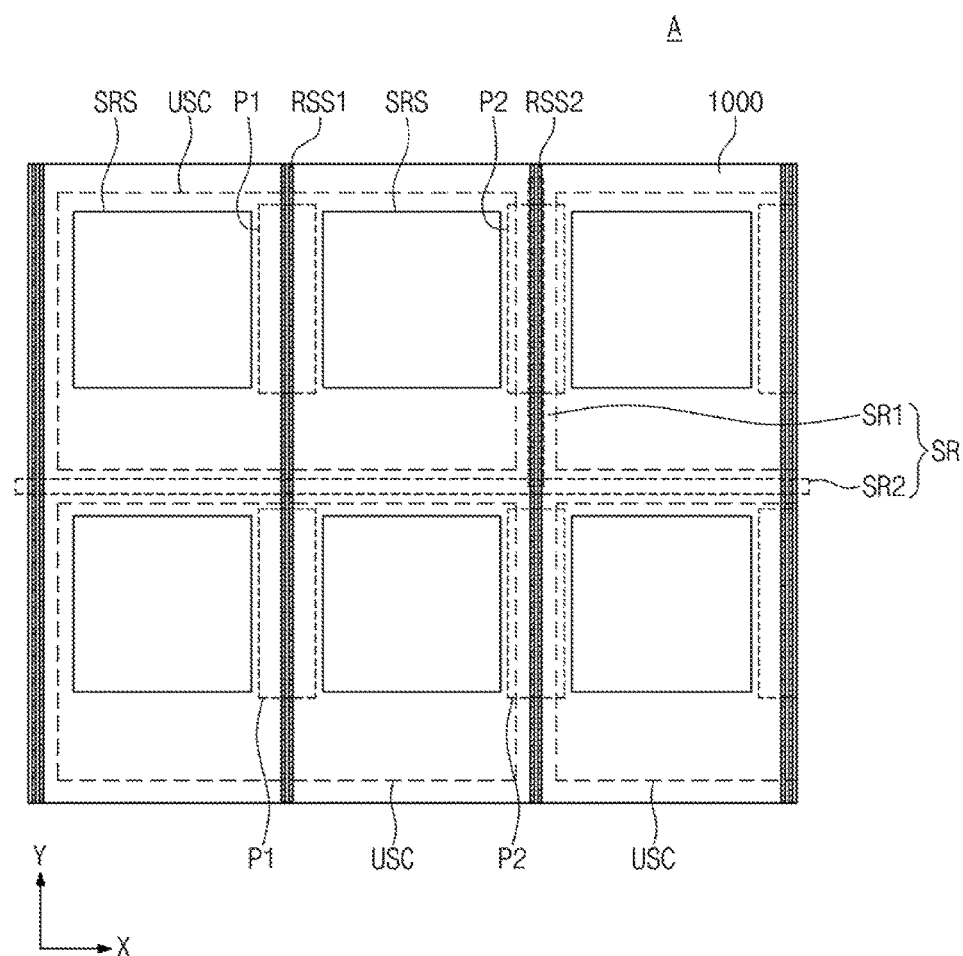
FIG. 13 is an enlarged view of section A of FIG. 2.

FIG. 13 is an enlarged view of section A of FIG. 2. For brevity of description, the same elements of a semiconductor memory device according to exemplary embodiments use the same reference numerals and duplicate explanations thereof are omitted.

Referring to FIG. 13, according to embodiments, the first separation structures RSS1 are disposed on the first part P1 between a pair of cell arrays SRS in the unit semiconductor chip USC. The second separation structures RSS2 are disposed on the first scribing region SR1 between the unit semiconductor chips USC. In an embodiment, the number of the first separation structures RSS1 is the same as the number of the second separation structures RSS2.

According to embodiments, the first and second separations structures RSS1 and RSS2 extend in the second direction Y. The first separation structures RSS1 cross the first part P1 and the second scribing region SR2, and the second separation structures RSS2 cross the first and second scribing regions SR1 and SR2.

Figure 14:
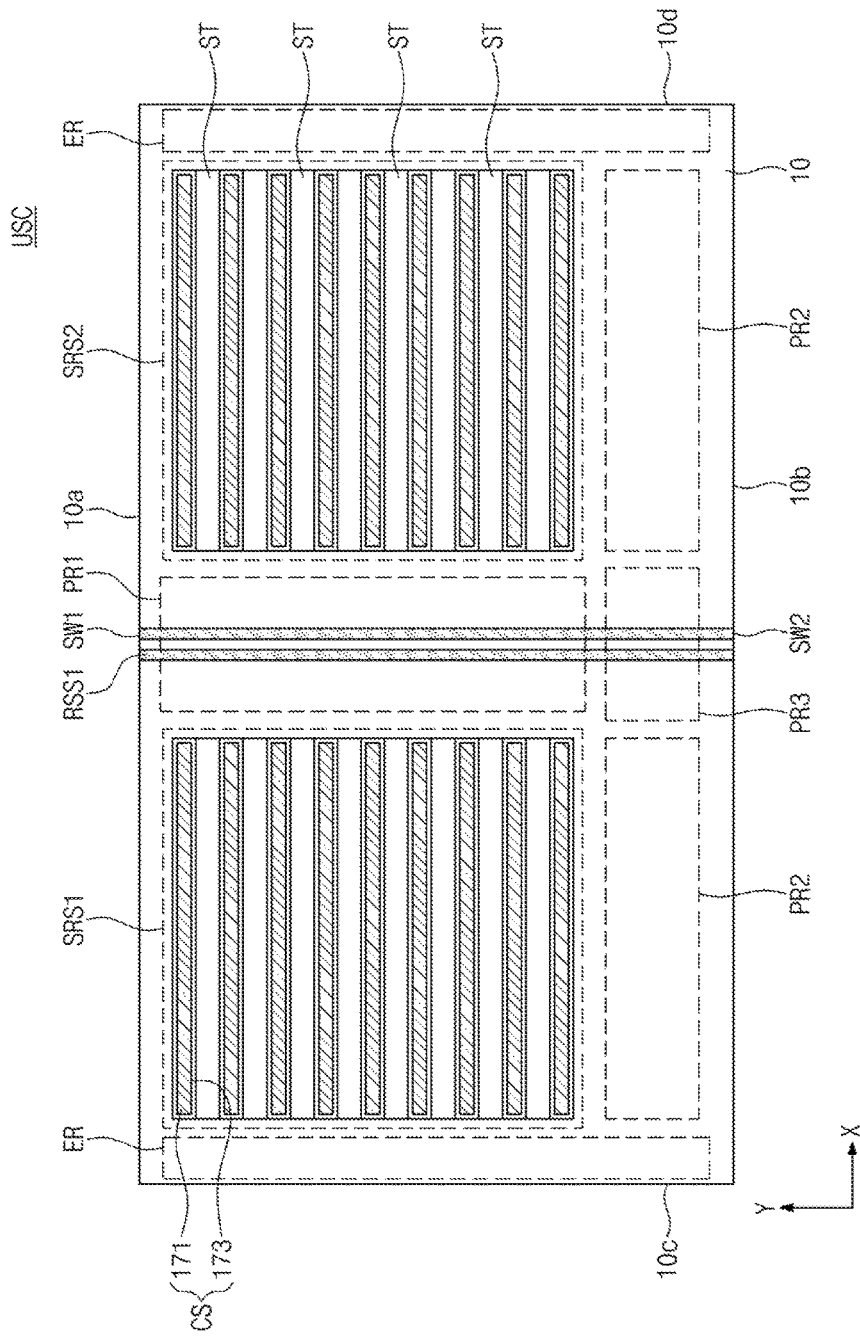
FIG. 14 is a plan view that illustrates a single unit semiconductor chip formed by cutting the semiconductor wafer of FIG. 13.

FIG. 14 is a plan view that illustrates a single unit semiconductor chip formed by cutting the semiconductor wafer of FIG. 13. For brevity of description, the same elements of a semiconductor memory device according to exemplary embodiments use the same reference numerals and duplicate explanations thereof are omitted.

Referring to FIG. 14, according to embodiments, the first separation structures RSS1 are disposed on the first peripheral circuit region PR1 of the substrate 10. As viewed in a plan view, the first separation structures RSS1 extend across the first and third peripheral circuit regions PR1 and PR3. The first surfaces SW1 of the first separation structures RSS1 are coplanar with the first surface 10a of the substrate 10, and the second surfaces SW2 of the second separation structures RSS1 are coplanar with the second surface 10b of the substrate 10.

Referring to FIGS. 13 and 14, according to embodiments, each of the edge regions ER corresponds to a portion of the second part P2 that excludes the first scribing region SR1 and a portion of the second scribing region SR2. There are no second separation structures RSS2 in the edge regions ER. The first scribing region SR1 on which the second separation structures RSS2 are disposed are used to divide the unit semiconductor chips USC during a scribing process on the semiconductor wafer 1000. Accordingly, the unit semiconductor chip USC has no the second separation structures RSS2.

Figure 15:
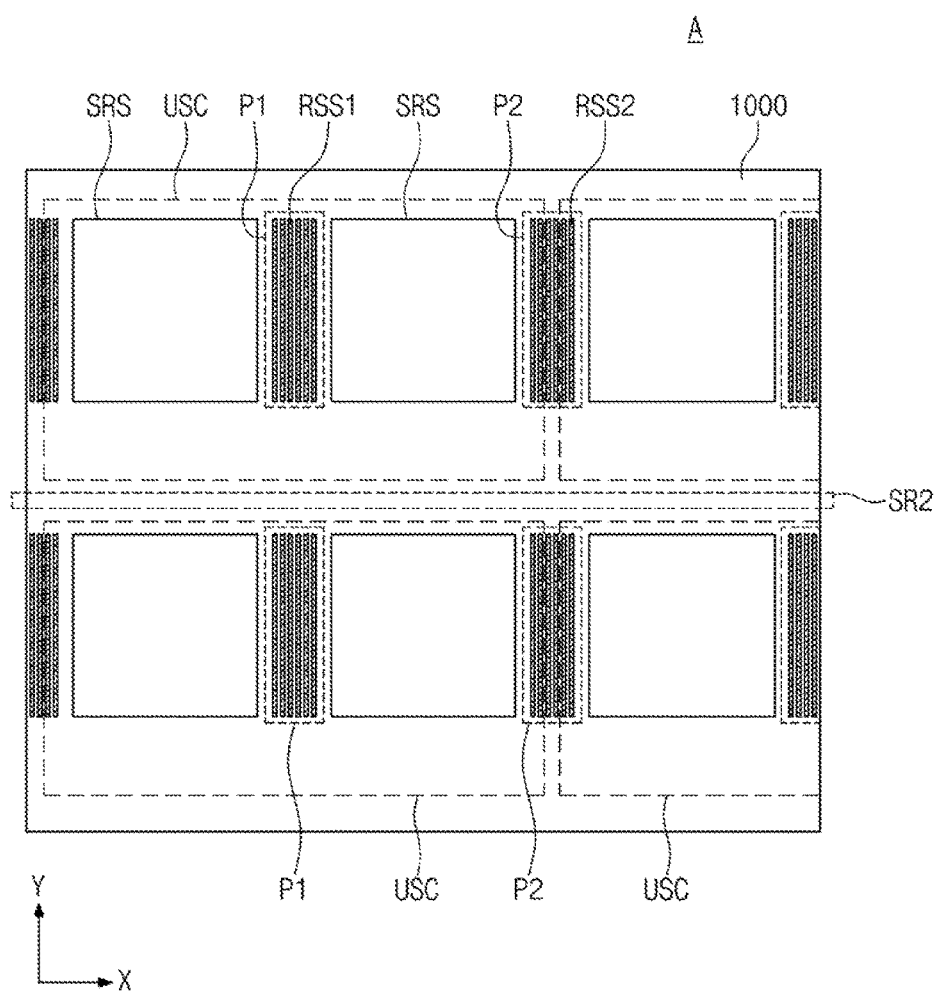
FIG. 15 is an enlarged view of section A of FIG. 2.

FIG. 15 is an enlarged view of section A of FIG. 2. For brevity of description, the same elements of a semiconductor memory device according to exemplary embodiments use the same reference numerals and duplicate explanations thereof are omitted.

Referring to FIG. 15, the first separation structures RSS1 extend in the second direction Y and are disposed on the first parts P1 of the semiconductor wafer 1000, and the second separation structures RSS2 extend in the second direction Y and are disposed on the second part P2 of the semiconductor wafer 1000. The first and second separation structures RSS1 and RSS2 are spaced apart from the second scribing region SR2. In other words, the first and second separation structures RSS1 and RSS2 do not extend across the second scribing region SR2. The number of first separation structures RSS1 is the same as that of the second separation structures RSS2.

Figure 16:
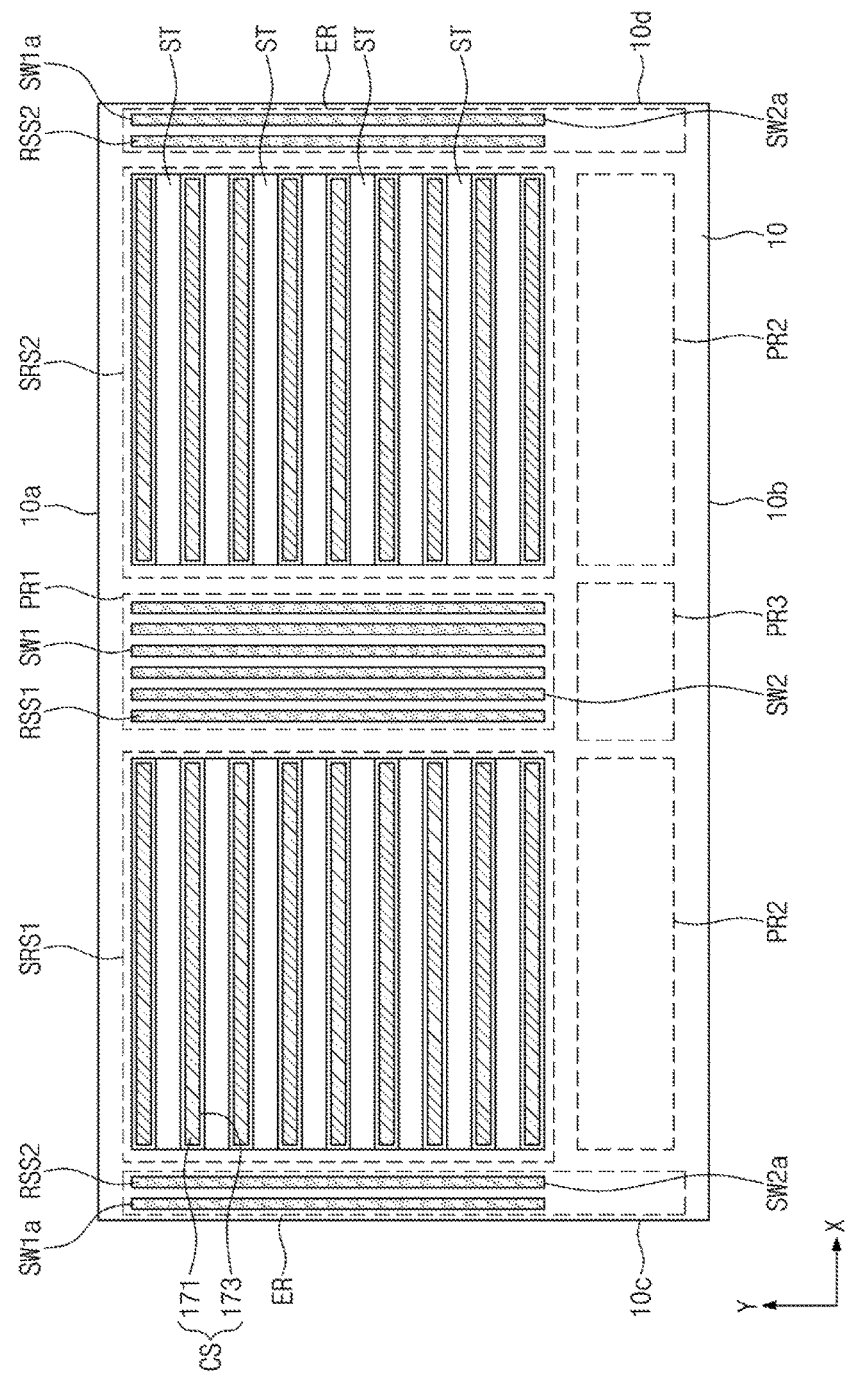
FIG. 16 is a plan view that illustrates a single unit semiconductor chip formed by cutting the semiconductor wafer of FIG. 15.

FIG. 16 is a plan view that illustrates a single unit semiconductor chip formed by cutting the semiconductor wafer of FIG. 15. For brevity of description, the same elements of a semiconductor memory device according to exemplary embodiments use the same reference numerals and duplicate explanations thereof are omitted.

Referring to FIG. 16, according to embodiments, the first separation structures RSS1 are disposed on the first peripheral circuit region PR1 of the substrate 10, and the second separation structures RSS2 are disposed on each of the edge regions ER of the substrate 10. The first separation structures RSS1 are spaced apart from the third peripheral circuit region PR3 of the substrate 10. The first separation structures RSS1 therefore do not extend across the third peripheral circuit region PR3. The second separation structures RSS2 extends partly across the edge regions ER.

According to embodiments, the first surface 10a of the substrate 10 is spaced apart from the first surfaces SW1 and SW1a of the first and second separation structures RSS1 and RSS2. The second surface 10b of the substrate 10 is spaced apart from the second surfaces SW2 and SW2a of the first and second separation structures RSS1 and RSS2.

In an embodiment, the number of the first separation structures RSS1 differs from that of the second separation structures RSS2. For example, the number of the first separation structures RSS1 may be greater than that of the second separation structures RSS2.

Figure 17:
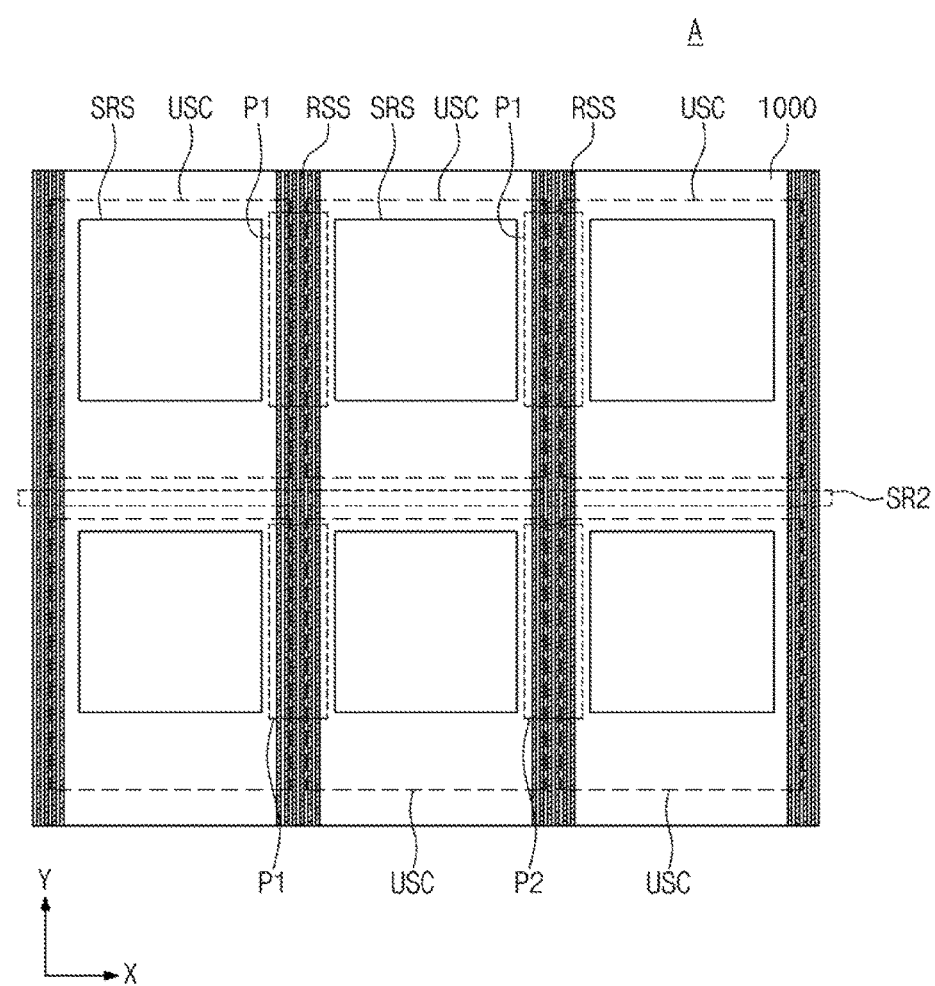
FIG. 17 is an enlarged view of section A of FIG. 2.

FIG. 17 is an enlarged view of section A of FIG. 2. For brevity of description, the same elements of a semiconductor memory device according to exemplary embodiments use the same reference numerals and duplicate explanations thereof are omitted.

Referring to FIG. 17, according to embodiments, the semiconductor wafer 1000 includes the first parts P1 between the cell arrays SRS facing each other in the first direction X. The separation structures RSS are disposed on the first parts P1 of the semiconductor wafer 1000. The separation structures RSS are arranged in the first direction X and extend in the second direction Y. In an embodiment, a single unit semiconductor chip USC includes a single cell array SRS.

Figure 18:
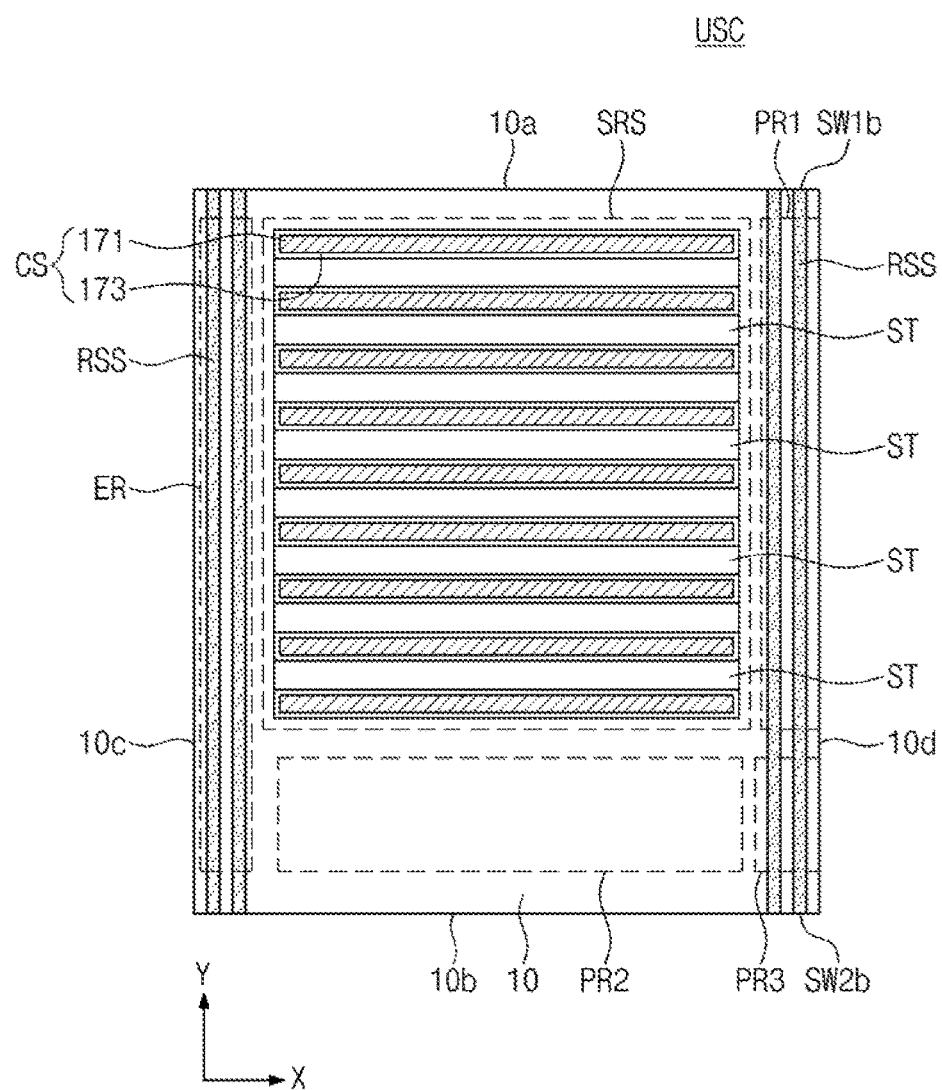
FIG. 18 is a plan view that illustrates a single unit semiconductor chip formed by cutting the semiconductor wafer of FIG. 17.

FIG. 18 is a plan view that illustrates a single unit semiconductor chip formed by cutting the semiconductor wafer of FIG. 17. For brevity of description, the same elements of a semiconductor memory device according to exemplary embodiments use the same reference numerals and duplicate explanations thereof are omitted.

Referring to FIG. 18, according to embodiments, the substrate 10 includes the cell array SRS, the first peripheral circuit region PRI, the second peripheral circuit region PR2, the third peripheral circuit region PR3, and the edge region ER. The cell array SRS corresponds to the memory device region. The cell array SRS is disposed on a central portion of the substrate 10. As viewed in a plan view, the first peripheral circuit region PR1 is disposed between the cell array SRS and the fourth surface 10d of the substrate 10. The second peripheral circuit region PR2 is disposed between the cell array SRS and the second surface 10b of the substrate 10. The third peripheral circuit region PR3 is disposed between the first peripheral circuit region PR1 and the second surface 10b of the substrate 10 and between the second peripheral circuit region PR2 and the fourth surface 10d of the substrate 10. The edge region ER is disposed between the cell array SRS and the third surface 10c of the substrate 10 and between the second peripheral circuit region PR2 and the third surface 10c of the substrate 10. The edge region ER and the first peripheral circuit region PR1 face each other in the first direction X with the cell array SRS interposed therebetween.

According to embodiments, the separation structures RSS are disposed on the first peripheral circuit region PR1 and the edge region ER. As viewed in a plan view, the separation structures RSS extend in the second direction Y. The separation structures RSS on the first peripheral circuit region PR1 extend across the first and third peripheral circuit regions PR1 and PR3. The separation structures RSS on the edge region ER extend across the edge region ER.

According to embodiments, the separation structures RSS include the first and second surfaces SW1b and SW2b that face each other in the second direction Y. The first surfaces SW1b of the separation structures RSS are adjacent to the first surface 10a of the substrate 10, and the second surfaces SW2b of the separation structures RSS are adjacent to the second surface 10b of the substrate 10. For example, the first surface 10a of the substrate 10 may coincide with the first surfaces SW1b of the separation structures RSS, and the second surface 10b of the substrate 10 may coincide with the second surfaces SW2b of the separation structures RSS.

In an embodiment, the number of the separation structures RSS on the first peripheral circuit region PR1 is the same as that of the separation structures RSS on the edge region ER.

Figure 19:
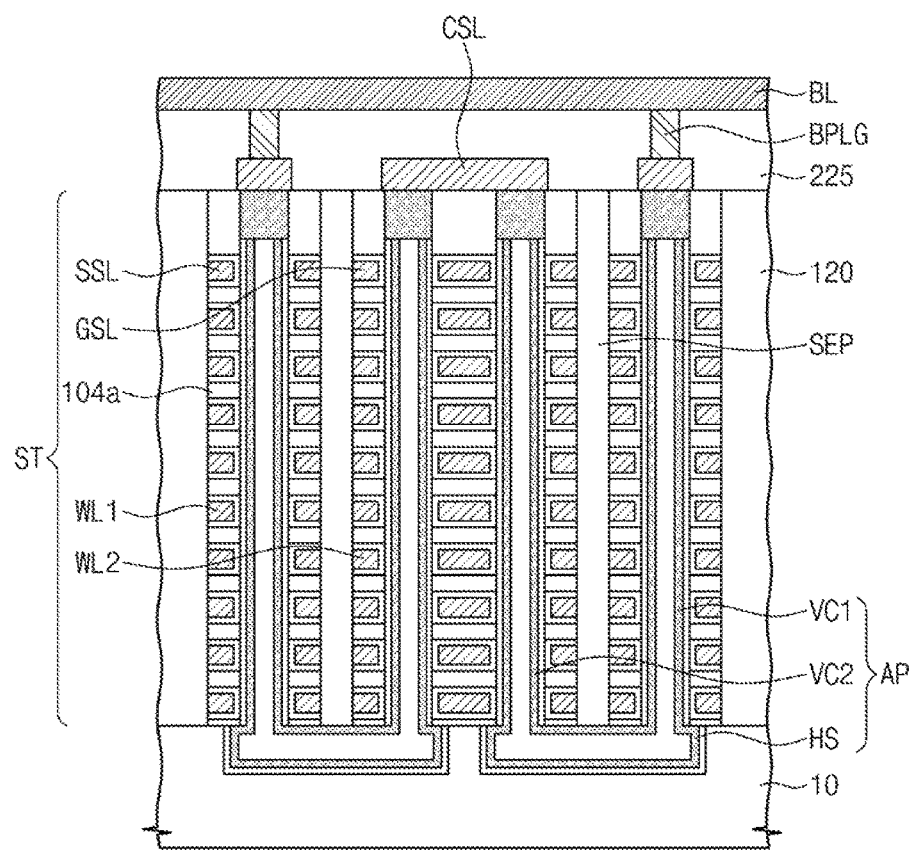
FIG. 19 is a cross-sectional view that illustrates a semiconductor memory device according to exemplary embodiments of the present inventive concept.

FIG. 19 is a cross-sectional view that illustrates a semiconductor memory device according to exemplary embodiments of the present inventive concept. Like reference numerals may be used to indicate elements substantially the same as those in a semiconductor memory device as described with reference to FIGS. 6 and 7, and detailed explanations thereof will be omitted.

Referring to FIG. 19, according to embodiments, a plurality of stack structures ST are disposed on the substrate 10. A plurality of vertical channels VC1 and VC2 are provided that penetrate the stack structures ST. Each of the stack structures ST includes the insulation patterns 104a and the electrodes that are repeatedly and alternately stacked on the substrate 10. In an embodiment, the stack structures ST extend in one direction and an insulating structure SEP is disposed between the stack structures ST. The insulating structure SEP includes an insulating material, such as silicon oxide, silicon nitride, or silicon oxynitride.

In an embodiment, the electrodes include the string selection line SSL, the word lines WL, and the ground selection line GSL. The string selection line SSL is disposed between the word line WL and the bit line BL. The ground selection line GSL is disposed between the word line WL and the common source line CSL. The word lines WL are vertically stacked on the substrate 10. The string selection line SSL and the ground selection line GSL are disposed on the word lines WL. The string selection line SSL and the ground selection line GSL are horizontally spaced apart from each other. The word lines WL include first word lines WL1 between the substrate 10 and the string selection line SSL and second word lines WL2 between the substrate 10 and the ground selection line GSL. The first word lines WL1 are horizontally spaced apart from the second word lines WL2.

According to embodiments, an interlayer dielectric layer 225 is disposed between the stack structures ST and the bit lines BL. The interlayer dielectric layer 225 includes the first interlayer dielectric layer MP and the second interlayer dielectric layer 190 depicted in FIGS. 6 and 7.

According to embodiments, an active pattern AP is provided that penetrates the stack structure ST. The active pattern AP includes vertical channels VC1 and VC2 and a horizontal channel HS which connects the vertical channels VC1 and VC2 to each other under the stack structure ST. The vertical channels VC1 and VC2 are disposed within vertical holes that penetrate the stack structure ST. The horizontal channel HS is disposed within a horizontal recess at an upper portion of the substrate 10, between the substrate 10 and the stack structure ST. One of the vertical channels VC1 and VC2 is connected to the common source line CSL and the other of the vertical channels VC1 and VC2 is connected to one of the bit lines BL.

According to embodiments, the first vertical channel VC1 penetrates through the first word lines WL1 and the string selection line SSL and the second vertical channel VC2 penetrates through the second word lines WL2 and the ground selection line GSL. The first vertical channel VC1 is connected to one of the bit lines BL, and the second vertical channel VC2 is connected to the common source line CSL. The horizontal channel HS extends under the first word lines WL1 and the second word lines WL2 to connect the first vertical channel VC1 to the second vertical channel VC2.

According to embodiments, the active pattern AP includes a semiconductor pattern that penetrates the stack structure ST and electrically connects to the substrate 10. The semiconductor pattern included in the vertical channels VC1 and VC2 covers inner walls of the vertical holes formed in the stack structure ST, and the semiconductor pattern included in the horizontal channel HS covers inner walls of the recess formed in the substrate 10. The semiconductor pattern includes a semiconducting material.

FIGS. 20A through 25A are cross-sectional views taken along line I-I' of FIG. 5 that illustrate a method of fabricating a semiconductor device according to exemplary embodiments of the present inventive concept. FIGS. 20B through 25B are cross-sectional views taken along line II-II' of FIG. 5 that illustrate a method of fabricating a semiconductor device according to exemplary embodiments of the present inventive concept.

Figure 20A:
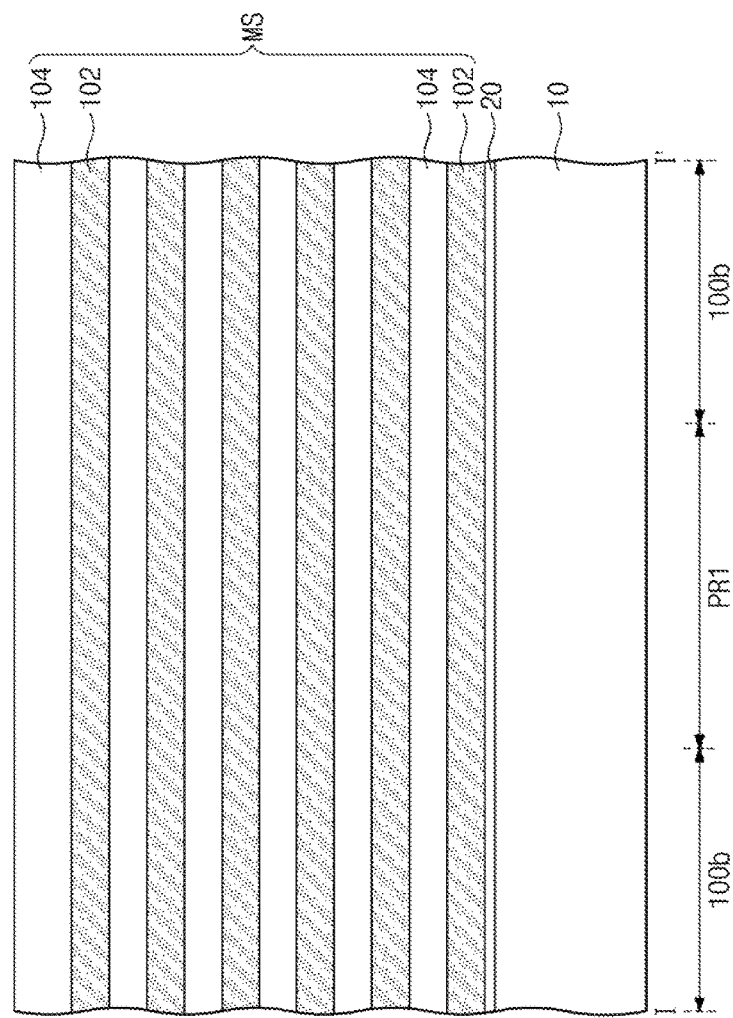
Figure 20B:
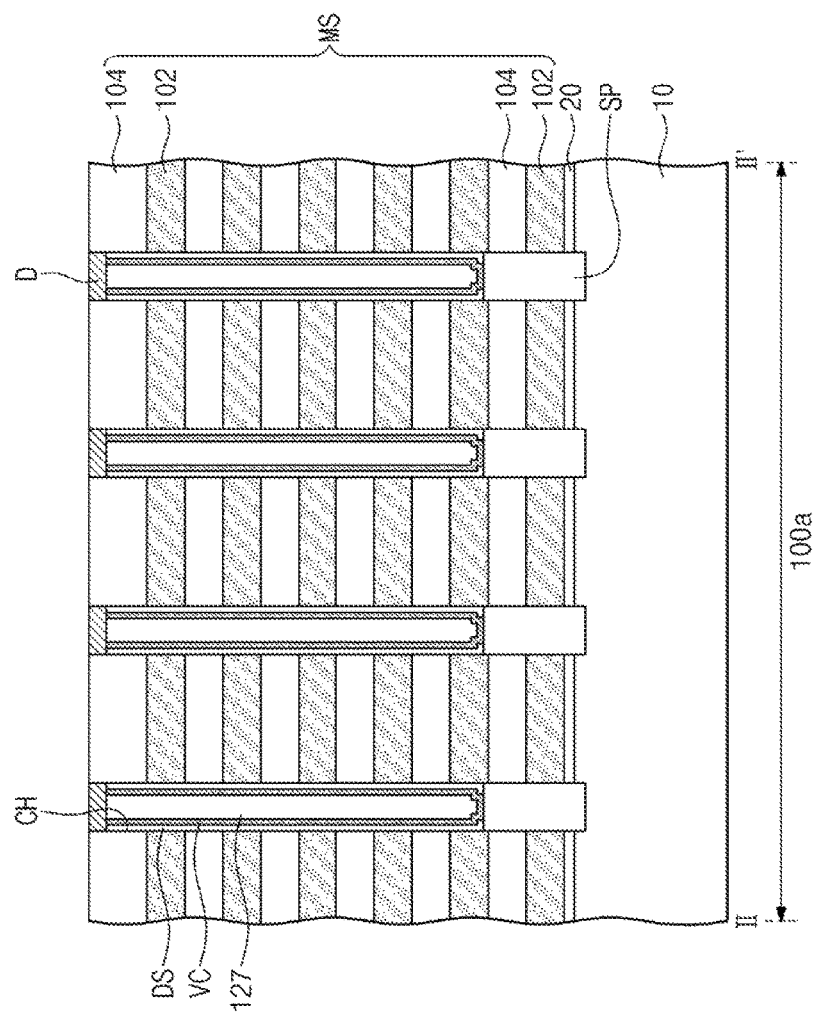

Referring to FIGS. 20A and 20B, according to embodiments, a substrate 10 is provided. The substrate 10 includes a cell array region 100a, a peripheral circuit region PR1, and a contact region 100b on the circumference of the cell array region 100a. The substrate 10 may be a silicon substrate, a silicon-germanium substrate, a germanium substrate, or a single crystalline silicon substrate having an epitaxial layer grown thereon. A device isolation layer defines an active region on the substrate 10.

According to embodiments, the peripheral circuit region PR1 of the substrate 10 corresponds to a row-decoder region of semiconductor memory device.

According to embodiments, a mold structure MS is formed on the substrate 10. The mold structure MS includes sacrificial layers 102 and insulation layers 104. The sacrificial layers 102 and the insulation layers 104 are stacked alternately and repeatedly on the substrate 10. The sacrificial layers 102 include a material having an etch selectivity with respect to the insulation layers 104. For example, the sacrificial layers 102 may include a silicon nitride layer, and the insulation layers 104 may include a silicon oxide layer.

According to embodiments, a buffer insulation layer 20 is formed between the substrate 10 and the mold structure MS. The buffer insulation layer 20 is formed of a material having an etch selectivity with respect to the sacrificial layers 102. For example, the buffer insulation layer 20 may include a silicon nitride layer.

According to embodiments, the mold structure MS is patterned to form channel holes CH on the cell array region 100a of the substrate 10. For example, a mask pattern that covers the contact region 100b and the peripheral circuit region PR1 and has openings that partially expose the cell array region 100a can be formed on the mold structure MS, and then the exposed insulation layers 104 and the sacrificial layers 102 can be substantially patterned to form the channel holes CH. The patterning process for forming the channel holes CH is performed until the top surface of the substrate 10 is exposed. An anisotropic etch process is carried out to form the channel holes CH, each having substantially the same width along a direction normal to the substrate 10. Alternatively, the anisotropic etch process can form channel holes CH having widths that vary depending on the distance from the substrate 10. In other words, the channel holes CH may have sloped inner walls. As shown in figures, the anisotropic etch process can etch the substrate 10 so that the top surface of the substrate 10 is recessed. As viewed in a plan view, the channel holes CH may have circular, elliptical, or polygonal shapes.

According to embodiments, a semiconductor pillar SP is formed on the exposed substrate 10 through the channel hole CH. For example, the semiconductor pillar SP may be formed by a selective epitaxial growth using the substrate 10 exposed though the channel hole CH as a seed. The semiconductor pillar SP may be, for example, an intrinsic semiconductor or a p-type semiconductor.

According to embodiments, a charge storage structure DS is formed in the channel hole CH. The charge storage structure DS conformally covers a portion of the sidewall of the channel hole CH and a portion of a top surface of the semiconductor pillar SP. The charge storage structure DS may be formed by, for example, a chemical vapor deposition (CVD) process or an atomic layer deposition (ALD) process.

According to embodiments, as shown in FIG. 8, the charge storage structure DS includes a blocking insulation layer BLL, a charge storage layer CTL, and a tunnel insulation layer TL that are sequentially formed on the sidewall of the channel hole CH and the top surface of the semiconductor pillar SP. The blocking insulation layer BLL may be formed by, for example, a silicon oxide layer or a high-k dielectric layer such as $Al_2O_3$ or $HfO_2$; the charge storage layer CTL may be formed by, for example, a silicon nitride layer; and the tunnel insulation layer TL may be formed by, for example, a silicon oxynitride layer or a high-k dielectric layer such as $Al_2O_3$ or $HfO_2$.

Referring back to FIGS. 20A and 20B, according to embodiments, a vertical channel VC is formed in the channel hole CH having the charge storage structure DS formed therein. The vertical channel VC conformally covers a surface of the charge storage structure DS and an exposed top surface of the semiconductor pillar SP. The vertical channel VC includes a semiconducting material. For example, the vertical channel VC may include at least one of a polycrystalline silicon layer, an organic semiconducting layer, or a carbon nanostructure.

According to embodiments, a gap fill layer 127 is formed in a region in the channel hole CH surrounded by the vertical channel VC. The gap fill layer 127 completely fills the channel hole CH. The gap fill layer 127 may be formed by a SOG technique. The gap fill layer 127 may include an insulating material selected from, for example, one of silicon oxide and silicon nitride.

According to embodiments, a pad D is formed on top surfaces of the charge storage structure DS, the vertical channel VC, and the gap fill layer 127. Upper portions of the charge storage structure DS, the vertical channel VC, and the gap fill layer 127 are etched to form a recess region, and then the recess region are filled with a conducting material to form the pad D. Alternatively, the pad D may be formed by implanting impurities having a conductivity different from that of the vertical channel VC into the upper portion of the vertical channel VC.

Figure 21A:
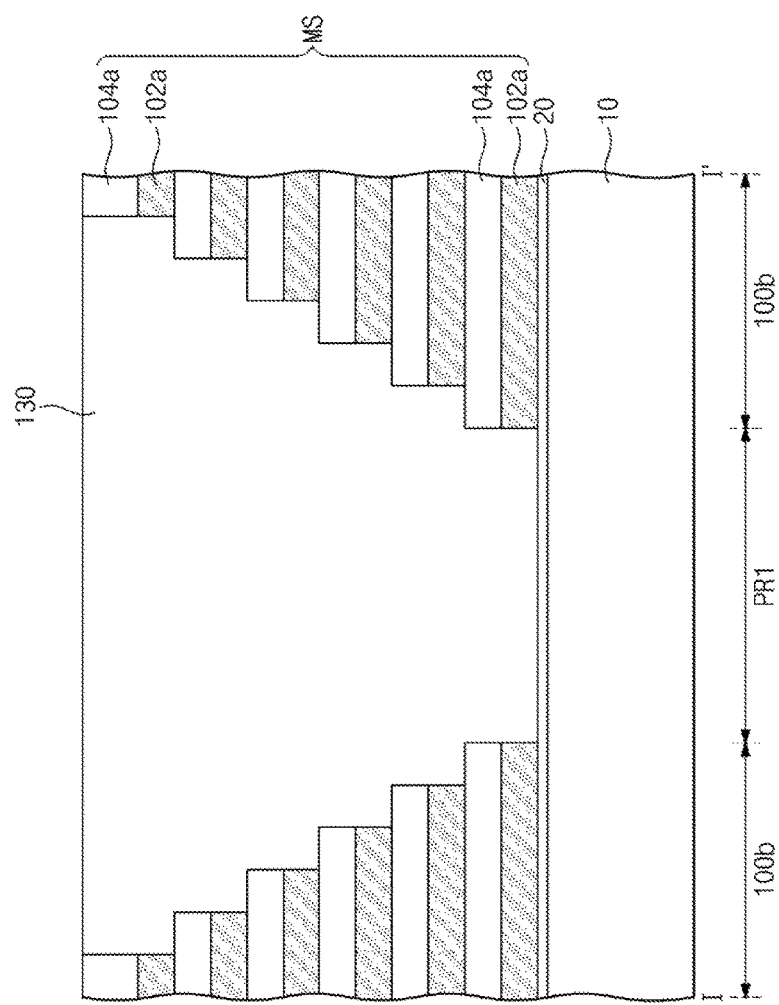
Figure 21B:
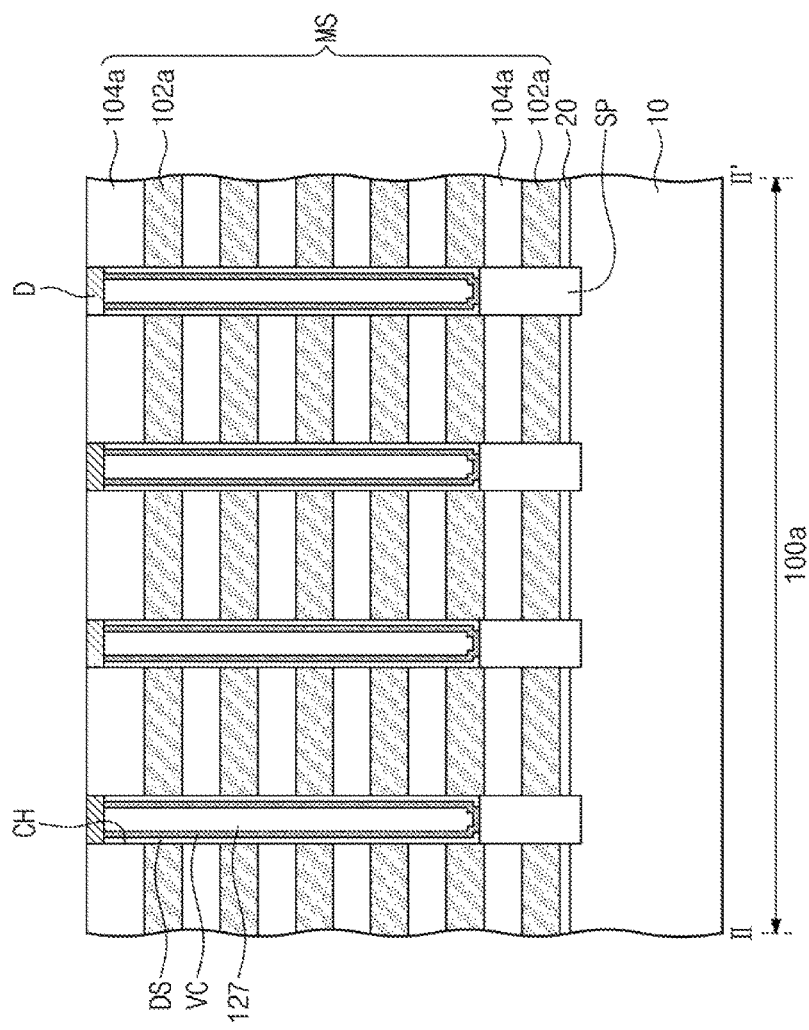

Referring to FIGS. 21A and 21B, according to embodiments, the mold structure MS is patterned by an etch process using a mask pattern thereon. Accordingly, the mold structure MS is formed to have a stair-shape that includes insulation patterns 104a and sacrificial patterns 102 that are stacked on the contact region 100b of the substrate 10.

According to embodiments, the stair-shaped mold structure MS is obtained by repeatedly etching the insulation layers 104 and the sacrificial layers 102 of FIGS. 21A and 21B using a mask pattern that is laterally reduced by repeatedly etching sidewalls thereof.

For example, an initial mask pattern may be formed to cover the mold structure MS on the cell array region 100a and contact region 100b of the substrate 10 and to expose the mold structure MS on the peripheral circuit region PR1. A first etch process using the initial mask pattern as an etch mask is performed to remove the insulation layers 104 and the sacrificial layers 102 formed on the peripheral circuit region PR1. The first etch process exposes a top surface of the buffer insulation layer 20 covering the peripheral circuit region PR1.

The initial mask pattern is decreased to have a reduced horizontal area, and then a second etch process using the decreased mask pattern as an etch mask is performed to remove the insulation layers 104 and the sacrificial layers 102 formed on the contact region 100b of the substrate 10. In the second etch process, the insulation layers 104 and the sacrificial layers 102 are etched to a shallower depth than the first etch process. The second etch process can be repeatedly performed so that the stair-shaped mold structure MS is obtained on the contact region 100b of the substrate 10. For example, the mold structure MS may have a stair-shaped side, and the sacrificial patterns 102a and the insulation patterns 104a have horizontal areas that are reduced with increasing distance from the substrate 10.

After the etch process for forming the stair-shaped mold structure MS, a process is performed to remove the remaining mask pattern on the cell array region 100a of the substrate 10.

According to embodiments, an interlayer dielectric pattern 130 is formed on the contact region 100b and the peripheral region PR1. The interlayer dielectric pattern 130 is formed by forming an insulation layer on the substrate 10 and a planarization process is performed until an uppermost insulation pattern 104a is exposed. The interlayer dielectric pattern 130 fills a space between the mold structures MS that are spaced apart from each other in the first direction X of FIG. 5. The interlayer dielectric pattern 130 covers the buffer insulation layer 20 formed on the peripheral circuit region PR1, and further covers the stair-shaped sides of the mold structure MS. The interlayer dielectric pattern 130 has a top surface coplanar with a top surface of the uppermost insulation pattern 104a.

The interlayer dielectric pattern 130 may be formed by a process of, for example, physical vapor deposition (PVD), chemical vapor deposition (CVD), sub-atmosphere chemical vapor deposition (SACVD), low pressure chemical vapor deposition (LPCVD), plasma enhanced chemical vapor deposition (PECVD), or high density plasma chemical vapor deposition (HDP CVD).

The interlayer dielectric pattern 130 may be formed of a material having an etch selectivity with respect to the sacrificial patterns 102a. The interlayer dielectric pattern 130 may include, for example, HDP (high density plasma) oxide, TEOS (tetraethylorthosilicate), PE-TEOS (plasma enhanced tetraethylorthosilicate), O3-TEOS (O3-tetraethylorthosilicate), USG (undoped silicate glass), PSG (phosphosilicate glass), BSG (borosilicate glass), BPSG (borophosphosilicate glass), FSG (fluoridesilicate glass), SOG (spin on glass), TOSZ (tonen silazene), or any combination thereof. Alternatively, the interlayer dielectric pattern 130 may include silicon nitride, silicon oxynitride, or low-k material having low dielectric constant.

Figure 22B:
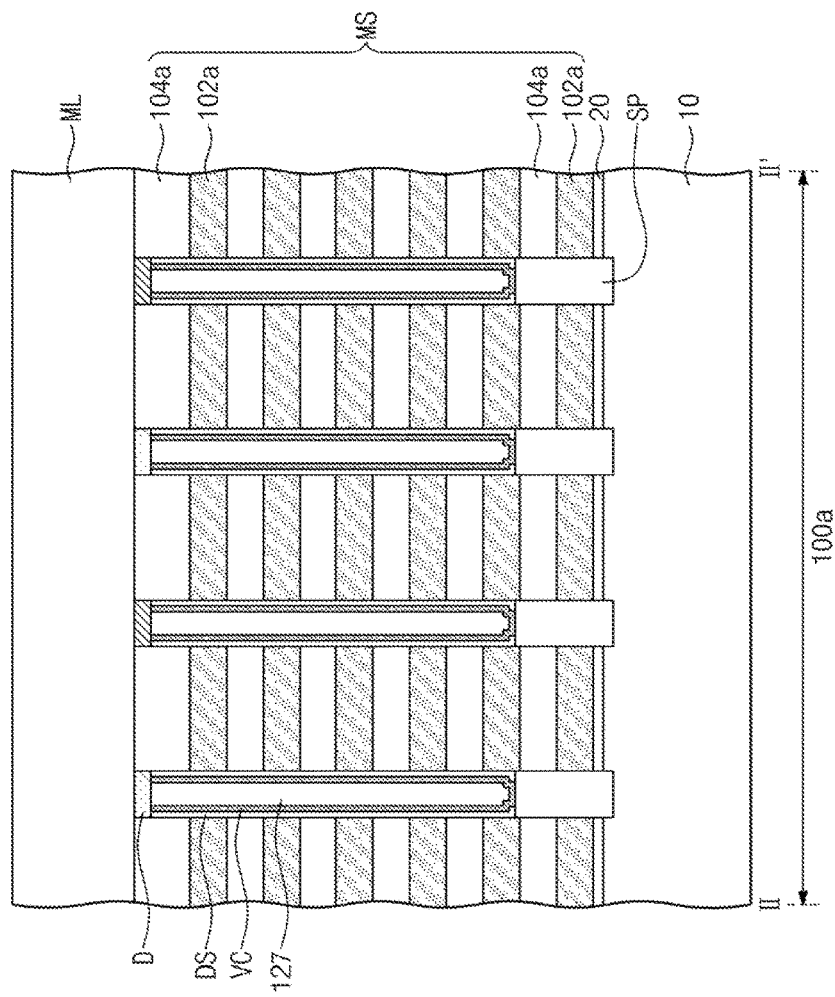

Referring to FIGS. 22A and 22B, according to embodiments, a mask layer ML is formed on the mold structure MS and the interlayer dielectric pattern 130. The mask layer ML has openings on the peripheral circuit region PR1 of the substrate 10. The openings partially expose the interlayer dielectric pattern 130 on the peripheral circuit region PR1.

According to embodiments, trenches 132 are formed in the interlayer dielectric pattern 130. For example, the interlayer dielectric pattern 130 and the buffer insulation layer 20 may be anisotropically etched using the mask layer ML as an etch mask to form the trenches 132. The trenches 132 are positioned on the peripheral circuit region P1 of the substrate 10. The trenches 132 are formed between the mold structures MS and are spaced apart from each other in the first direction X, and extend in the second direction Y crossing the first direction X. The trenches 132 form a recess in the top surface of the substrate 10. The trenches 132 therefore have a bottom surface whose level is lower than that of the top surface of the substrate 10.

According to embodiments, after forming the trenches 132, the mask layer ML is removed.

Figure 23A:
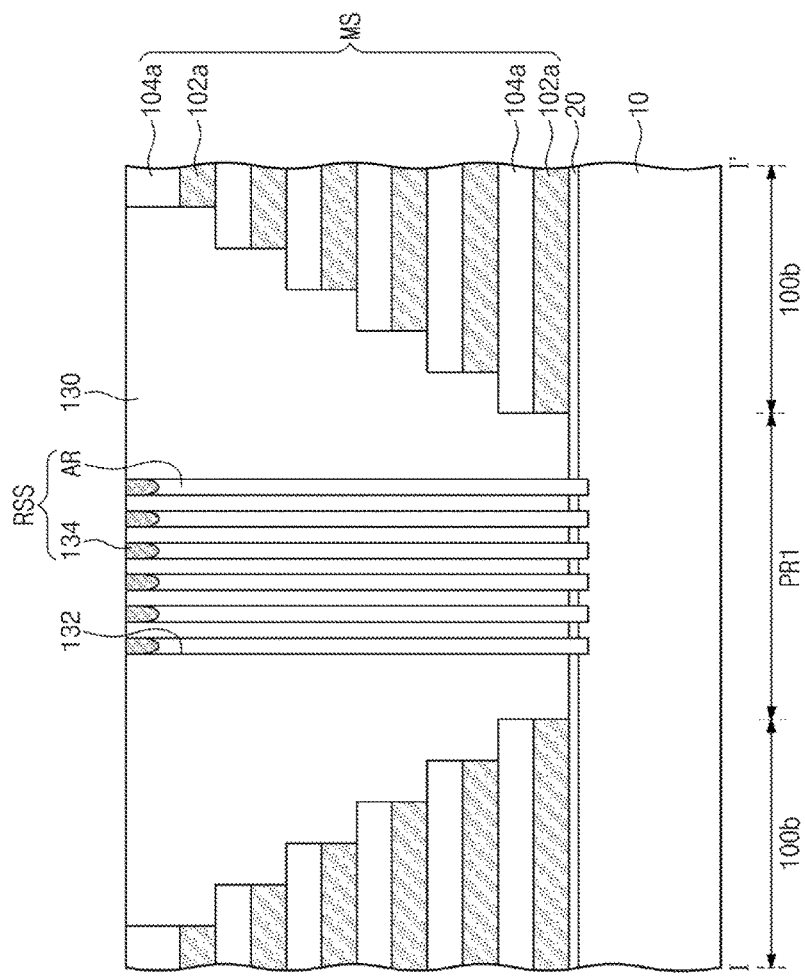
Figure 23B:
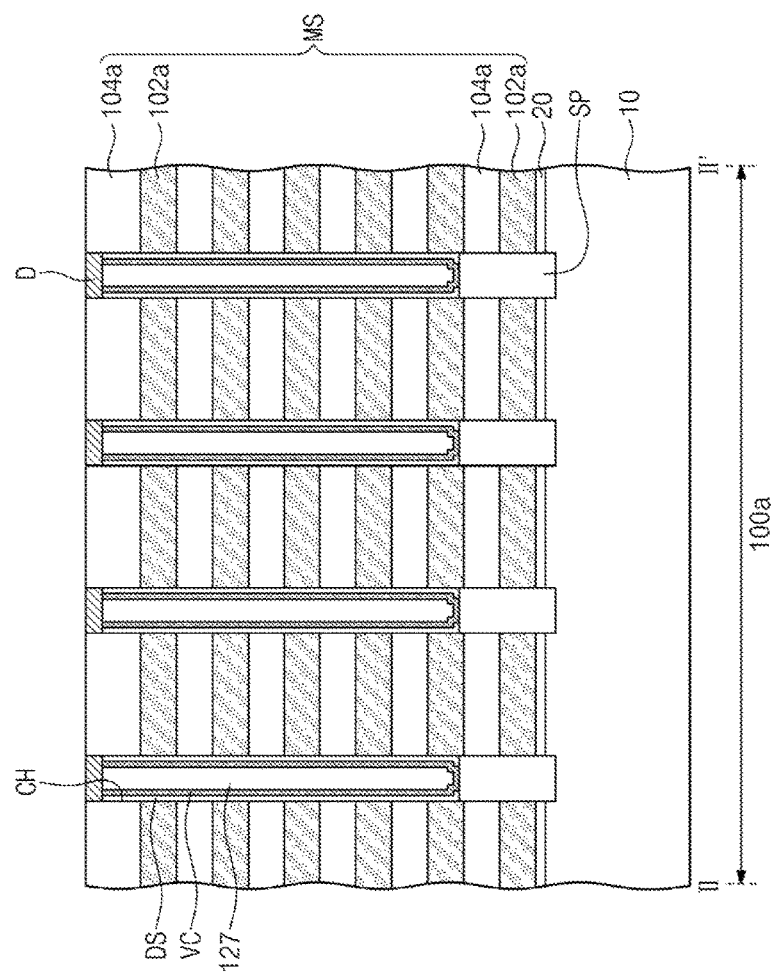

Referring to FIG. 23A and 23B, according to embodiments, capping patterns 134 are formed to fill upper portions of the trenches 132. The capping patterns 134 are formed by forming an insulation layer that covers the mold structures MS and the interlayer dielectric pattern 130 and fills the upper portion of the trenches 132, and then performing a polishing process on the insulation layer until the top surfaces of the interlayer dielectric pattern 130 and the uppermost insulation patterns 104a are exposed. The capping pattern 134 includes an insulating material with low or poor step coverage, and thus the insulating material locally fills the upper portion of each of the trenches 132. The capping pattern 134 may include, for example, a TEOS (tetraethylorthosilicate) layer or an HDP (high density plasma) oxide layer. The capping pattern 134 is formed by a deposition process with poor step coverage, such as a physical vapor deposition process.

According to embodiments, the capping patterns 134 are formed in the trenches 132, and thus separation structures RSS are formed on the peripheral circuit region PR1 of the substrate 10. The separation structures RSS include the capping patterns 134 and air gaps AR. The air gap AR is formed between the substrate 10 and the capping pattern 134 in a hollow space surrounded by portions of the substrate 10, the capping pattern 134, and the interlayer dielectric pattern 130 that are exposed through sidewalls of the trench 132.

In an embodiment, the separation structures RSS cut off stress connections that act in a direction substantially parallel to the top surface of the substrate 10, i.e., the first direction X. This will be described in detail with reference to FIGS. 25A and 25B.

Figure 24A:
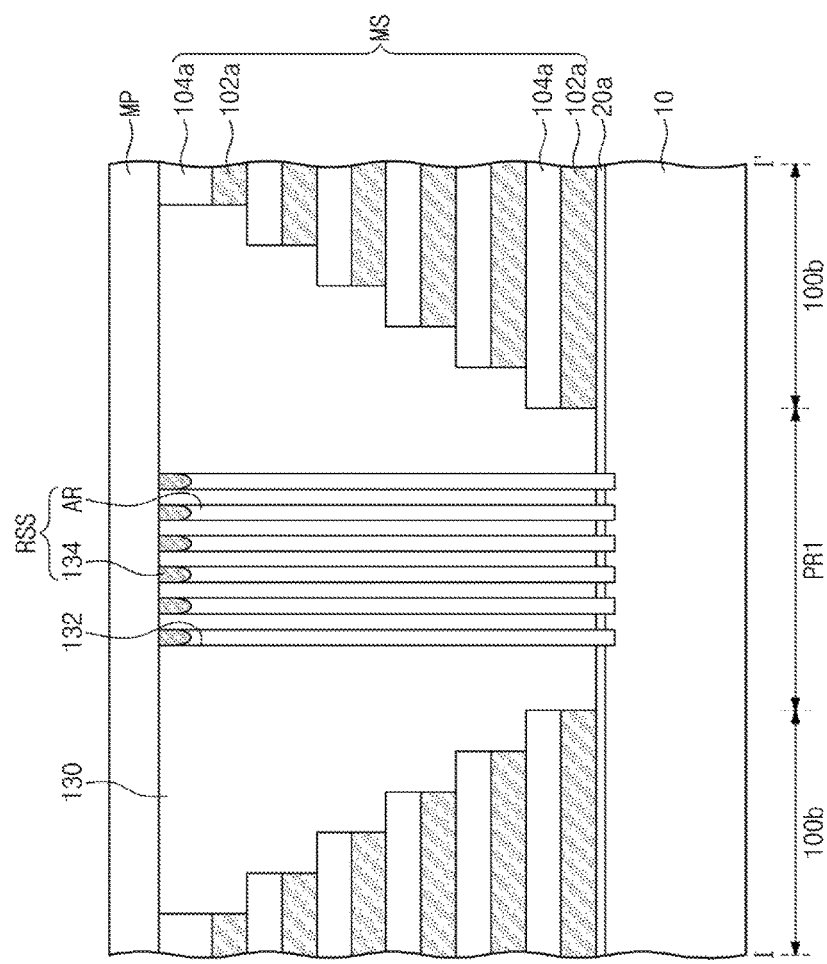

Referring to FIGS. 24A and 24B, according to embodiments, a first interlayer dielectric layer MP is formed on the interlayer dielectric pattern 130 and the mold structures MS. The first interlayer dielectric layer includes openings on the cell array region 100a of the substrate 10.

According to embodiments, the mold structures MS and the buffer insulation layer 20 are patterned to form common source trenches CST. For example, the common source trenches CST may be formed by anisotropically etching the mold structures MS and the buffer insulation layer 20 using the first interlayer dielectric layer MP as an etch mask until the top surface of the substrate 10 is exposed. As viewed in a plan view, the common source trenches CST have a rectangular or linear shape that extends in the first direction X.

According to embodiments, the patterning process forms a buffer insulation pattern 20a between the mold structure MS and the substrate 10. Sidewalls of the sacrificial patterns 102a and the insulation patterns 104a are exposed through the common source trenches CST.

Figure 25A:
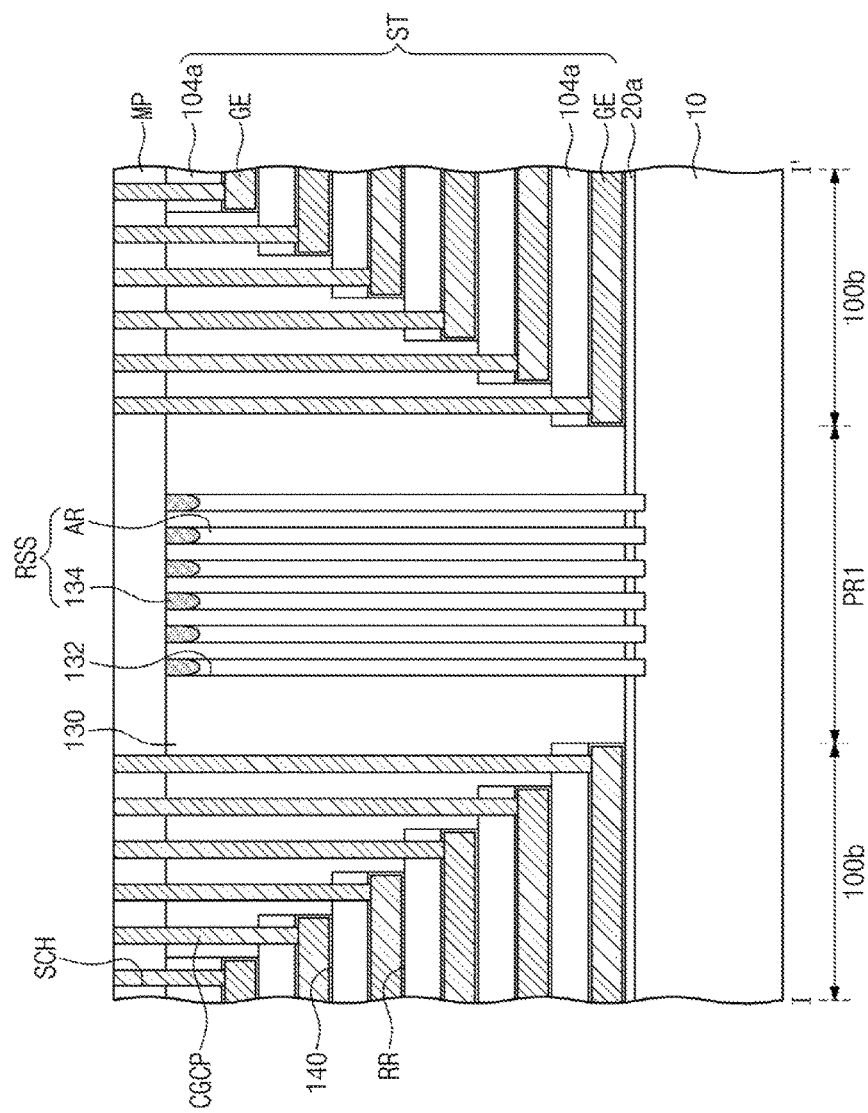
Figure 25B:
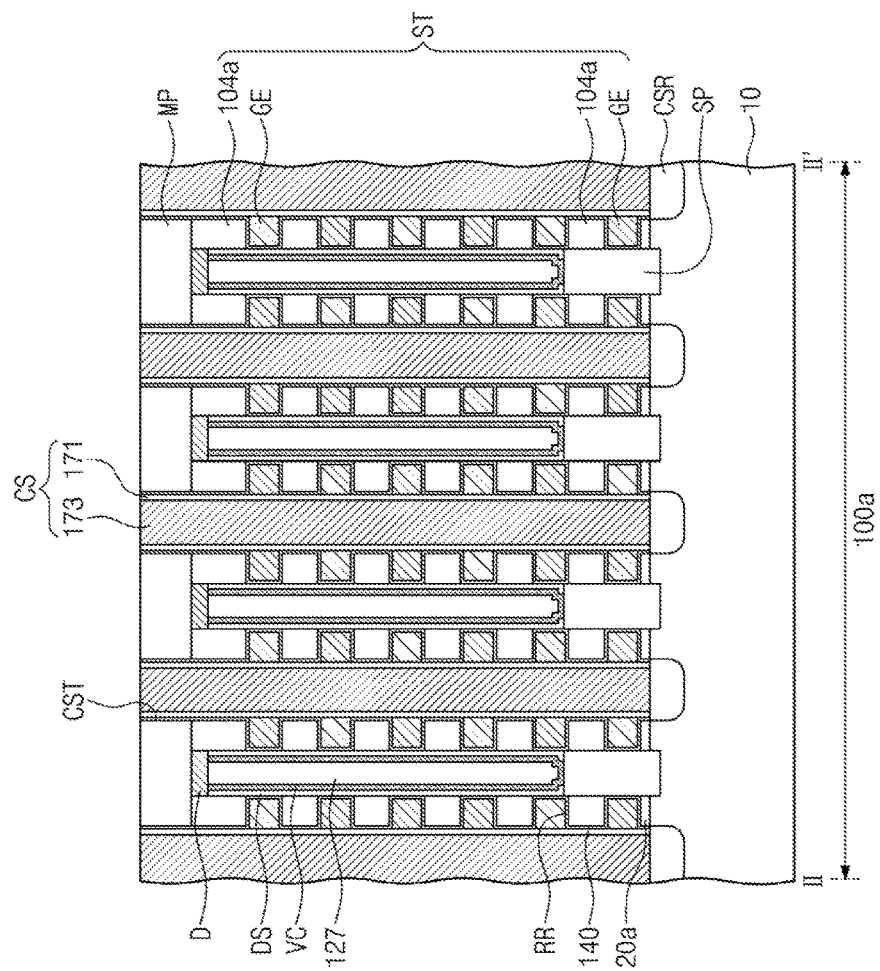

Referring to FIGS. 25A and 25B, according to embodiments, an etch process is performed to remove the exposed sacrificial patterns 102a through the common source trenches CST, and thus recess regions RR are formed. When the sacrificial patterns 102a are removed, the insulation patterns 104a and the interlayer dielectric pattern 130, which include a material with etch selectivity with respect to the sacrificial patterns 102a, are not removed. The etch process may be a wet etch process or an isotropic dry etch process. In case that the sacrificial patterns 102a include silicon nitride layers and the insulation patterns 104a and the interlayer dielectric pattern 130 include silicon oxide layers, the etch process uses an etchant comprising phosphoric acid.

According to embodiments, the recess regions RR is formed between the insulation patterns 104a that are vertically stacked on one another. The recess regions RR are gap regions that extend horizontally from the common source trenches CST between the insulation patterns 104a. The recess regions RR expose top and bottom surfaces of the insulation patterns 104a, a portion of an outer wall of the charge storage structure DS, and a portion of a sidewall of the semiconductor pillar SP.

According to embodiments, a horizontal insulation layer 140 is formed in the recess region RR. The horizontal insulation layer 140 conformally covers the top and bottom surfaces of the insulation patterns 104a, the outer wall portion of the charge storage structure DS, and the sidewall portion of the semiconductor pillar SP that are exposed through the recess region RR. The horizontal insulation layer 140 is formed by a deposition with good step coverage. For example, the horizontal insulation layer 140 may be formed by a chemical vapor deposition (CVD) process or an atomic layer deposition (ALD) process. The horizontal insulation layer 140 includes a dielectric layer, such as an aluminum oxide ($Al_2O_3$) layer, a hafnium oxide ($HfO_2$) layer, a zirconium oxide ($ZrO_2$) layer, a hafnium aluminum oxide (HfAlO) layer, and/or a hafnium silicon oxide (HfSiO) layer.

According to embodiments, the recess regions RR is filled with a conducting material to form the gate electrodes GE. As such, the stack structures ST include the gate electrodes GE and the insulation patterns 104a that are alternately stacked on the substrate 10. The formation of the gate electrodes GE includes forming a conductive layer that fills the recess regions RR and selectively removing the conducting layer in the common source trenches CST but leaving the conducting layer in the recess regions RR. The conductive layer in the common source trenches CST may be removed by an anisotropic etch process. The gate electrodes GE include a conducting material. For example, the gate electrodes GE may include at least one of doped silicon, a metal, such as tungsten, copper, aluminum, etc., a conductive metal nitride, such as titanium nitride or tantalum nitride, or a transitional metal, such as titanium, tantalum, etc. The gate electrodes GE facing each other in the first direction X can exert a tensile stress in the first direction X. The tensile stresses can be connected with each other through the interlayer dielectric pattern 130 and the substrate 10. In an embodiment, the separation structures RSS cut off tensile stresses connections in the first direction X. Accordingly, the substrate 10 may be free of warping, so that a semiconductor device has a more stable performance and is more reliable.

According to embodiments, cell impurity regions CSR are formed in the exposed substrate 10 through the common source trenches CST. The cell impurity regions CSR are formed by implanting impurities into the substrate 10. The cell impurity regions CSR have a conductive type different from that of the substrate 10.

According to embodiments, contact structures CS are formed in the common source trenches CST. Each of the contact structures CS includes a spacer 171 and a common source contact 173. The spacer 171 covers sidewalls of the common source trenches CST. The formation of the spacer 171 includes forming an insulation layer that covers inner walls of the common source trenches CST and partially etching the insulation layer on bottom walls of the common source trenches CST. The horizontal insulation layer 140 can be simultaneously etched when the insulation layer is partially etched. The spacer 171 may include, for example, a silicon oxide layer or a silicon nitride layer.

According to embodiments, the common source contact 173 is formed to fill the remaining space in the common source trench CST in which the spacer 171 is formed. The common source contact 173 may be formed by, for example, a chemical vapor deposition (CVD) process, a physical vapor deposition (PVD) process, or an atomic layer deposition (ALD) process. The common source contact 173 may include at least one of, for example, a metal, such as tungsten, copper, aluminum, etc., or a transitional metal, such as titanium, tantalum, etc.

According to embodiments, cell contact plugs CGCP are formed on the contact region 100b of the substrate 10. The cell contact plugs CGCP are formed by sequentially etching the first interlayer dielectric layer MP, the interlayer dielectric pattern 130 and the insulation patterns 104a to form cell contact holes SCH that expose end portions of the gate electrodes GE and filling the cell contact holes SCH with a conducting material. The cell contact plugs CGCP may include at least one of a metal, such as tungsten, copper, aluminum, etc., a conducting metal nitride, such as titanium nitride, tantalum nitride, etc., or a transitional metal, such as titanium, tantalum, etc.

Referring back to FIGS. 6 and 7, according to embodiments, a second interlayer dielectric layer 190 is formed on the first interlayer dielectric layer MP. The second interlayer dielectric layer 190 is formed to cover top surfaces of the cell contact plugs CGCP and the contact structures CS. The second interlayer dielectric layer 190 may include, for example, a silicon oxide layer or a silicon nitride layer.

According to embodiments, bit line contact plugs BPLG are formed that penetrate the second interlayer dielectric layer 190 and the first interlayer dielectric layer MP on the cell array region 100a of the substrate 10 and connect to the pads D. Contacts CP are formed that penetrate the second interlayer dielectric layer 190 on the contact region 100b of the substrate 10 and connect to the cell contact plugs CGCP. The bit line contact plugs BPLG and the contacts CP include a metal, such as tungsten.

According to embodiments, bit lines BL and connection lines CL are formed on the second interlayer dielectric layer 190. The bit lines BL and the connection lines CL are formed by depositing and patterning a conducting layer on the second interlayer dielectric layer 190.

According to embodiments, as shown in FIG. 5, the bit lines BL extend across the stack structures ST spaced apart from each other in the second direction Y and may be electrically connected to the bit line contact plugs BPLG. Each of the connection lines CL is electrically connected to at least one of the contacts CP in the second direction Y.

According to some embodiments of the present inventive concept, the separation structures that extend in the second direction are disposed between the stack structures that face each other in the first direction crossing the second direction. Accordingly, the separation structures can cut off tensile stresses connections exerted by the gate electrodes in the stack structures.

Although embodiments of the present disclosure have been described in connection with exemplary embodiments as illustrated in the accompanying drawings, it is not limited thereto. It will be apparent to those skilled in the art that various substitution, modifications and changes may be thereto without departing from the scope and spirit of the exemplary embodiments.

What is claimed is:

1. A semiconductor memory device, comprising:
a substrate that includes a first cell array region and a peripheral region, the peripheral region including first and second peripheral regions that face each other in a first direction in a plan view with the first cell array region interposed therebetween;
a plurality of stack structures that extend in the first direction on the first cell array region of the substrate and that are spaced apart from each other in a second direction crossing the first direction in a plan view;
an insulation layer that covers the stack structures; and
a plurality of separation structures that extends in the second direction on at least one of the first and second peripheral regions and that penetrates the insulation layer in a direction normal to a top surface of the substrate, the plurality of separation structures being spaced apart from each other in the first direction.

2. The semiconductor memory device of claim 1,
wherein the substrate comprises a first surface and a second surface that face each other in the second direction, in a plan view, and
wherein each separation structure comprises a first surface and a second surface that face each other in the second direction, in a plan view,
the first surface of each separation structure is adjacent to and coplanar with the first surface of the substrate,
the second surface of each separation structure is adjacent to and coplanar with the second surface of the substrate.

3. The semiconductor memory device of claim 1,
wherein the substrate comprises a first surface and a second surface that face each other in the second direction, in a plan view, and
wherein each separation structure comprises a first surface and a second surface that face each other in the second direction, in a plan view,
the first surface of each separation structure is adjacent to and spaced apart from the first surface of the substrate,
the second surface of each separation structure is adjacent to and spaced apart from the second surface of the substrate.

4. The semiconductor memory device of claim 1, wherein the substrate further comprises a second cell array region that faces the first cell array region in the first direction with the first peripheral region interposed therebetween, and
wherein the semiconductor memory device further comprises a plurality of second stack structures that extend in the first direction on the second cell array region and that are spaced apart from each other in the second direction.

5. The semiconductor memory device of claim 4, wherein the first and second peripheral regions respectively comprise the plurality of separation structures disposed thereon, and a number of the separation structures on the first peripheral region is greater than a number of the separation structures on the second peripheral region.

6. The semiconductor memory device of claim 4, wherein the plurality of separation structures is disposed on the first peripheral region but not on the second peripheral region.

7. The semiconductor memory device of claim 1, further comprising a trench which is recessed from a top surface of the insulation layer and exposes a portion of the substrate, wherein each separation structure comprises:
a capping pattern in an upper portion of the trench; and
an air gap in the trench between the capping pattern and the substrate.

8. The semiconductor memory device of claim 7, wherein the trench comprises a bottom surface that is lower than the top surface of the substrate.

9. A semiconductor memory device, comprising:
a substrate that includes a cell array region, a peripheral region, and a contact region between the cell array region and the peripheral region;
a plurality of stack structures on the cell array region and the contact region of the substrate, the stack structures extending in a first direction in a plan view and being spaced apart from each other in a second direction crossing the first direction in a plan view;
an insulation layer on the contact region and the peripheral region of the substrate, the insulation layer covering the stack structures; and
a plurality of separation structures that extend in the second direction and penetrate the insulation layer on the peripheral region in a third direction that is normal to a top surface of the substrate, the plurality of separation structures being spaced apart from each other in the first direction.

10. The semiconductor memory device of claim 9, further comprising a trench that extends from the insulation layer in the third direction toward the top surface of the substrate,
wherein each separation structure comprises:
a capping pattern that fills an upper portion of the trench and closes the trench; and
an air gap defined by a hollow space in the closed trench.

11. The semiconductor memory device of claim 10, wherein the capping pattern comprises:
a top surface coplanar with the top surface of the insulation layer; and
a flat bottom surface.

12. The semiconductor memory device of claim 10, wherein the capping pattern comprises:
a top surface coplanar with the top surface of the insulation layer; and
a bottom surface that is curved toward the top surface of the substrate.

13. The semiconductor memory device of claim 10, wherein the capping pattern encloses an additional air gap.

14. The semiconductor memory device of claim 9, wherein the stack structure comprises a plurality of electrodes vertically stacked on the substrate, the electrodes including end portions exposed on the peripheral region;
wherein the semiconductor memory device further comprises contacts disposed on and connected to the end portions of the electrodes,
wherein each separation structure comprises a top surface lower than top surfaces of the contacts.

15. The semiconductor memory device of claim 9, further comprising contact structures that are disposed between adjacent stack structures and that extends in the first direction,
wherein each separation structure comprises a top surface that is lower than a top surface of the contact structures.

* * * * *